(12) United States Patent
Funatsu

(10) Patent No.: US 8,356,218 B2
(45) Date of Patent: Jan. 15, 2013

(54) FAULT LOCATION ESTIMATION DEVICE, FAULT LOCATION ESTIMATION METHOD, AND PROGRAM

(75) Inventor: Yukihisa Funatsu, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 293 days.

(21) Appl. No.: 12/801,193

(22) Filed: May 27, 2010

(65) Prior Publication Data

US 2010/0318864 A1    Dec. 16, 2010

(30) Foreign Application Priority Data

Jun. 12, 2009   (JP) ................................. 2009-141068

(51) Int. Cl.
*G01R 31/28* (2006.01)

(52) U.S. Cl. .......................................... 714/726; 714/30

(58) Field of Classification Search .................. 714/726, 714/729, 30
See application file for complete search history.

(56) References Cited

U.S. PATENT DOCUMENTS

| 6,904,554 | B2 * | 6/2005 | Block et al. .................... 714/733 |
| 7,240,261 | B2 * | 7/2007 | Huisman et al. ............... 714/726 |
| 7,788,561 | B2 * | 8/2010 | Huang et al. ................... 714/729 |
| 7,895,487 | B2 * | 2/2011 | Huisman et al. ............... 714/726 |
| 8,006,152 | B2 * | 8/2011 | Ward et al. ..................... 714/729 |
| 2008/0215943 | A1 * | 9/2008 | Guo et al. ....................... 714/729 |

OTHER PUBLICATIONS

Guo, et al., "A Technique for Fault Diagnosis of Defects in Scan Chains", ITC (International Test Conference), IEEE 2001, pp. 268-277.
Stanley, "High-Accuracy Flush-and-Scan Software Diagnostic", IEEE Design and Test of Computers, 2001, vol. 18, No. 6, pp. 56-62.
Huang, et al., "Using Fault Model Relaxation to Diagnose Real Scan Chain Defects," ASP-DAC, 2005, pp. 1176-1179.

* cited by examiner

*Primary Examiner* — Esaw Abraham
(74) *Attorney, Agent, or Firm* — McGinn IP Law Group, PLLC

(57) ABSTRACT

A fault location estimation device includes: a faulty scan chain identification unit that identifies a faulty scan chain and its fault type based on result of operation verification test; a faulty scan FF narrowing unit that compares test result of the faulty scan chain with simulation result for determining a faulty scan FF range beginning at the location of a scan FF where both results differ; and a path trace narrowing unit that references logic circuit configuration information, signal line expected value, a failure-observed scan FF, and test result of a defective circuit to extract a scan FF on the faulty scan chain, which may be reached from a failure-observed scan FF observed on a normal scan chain by tracing back a failure propagation path while performing implication procedure for an input side, and thereby further narrows the faulty scan FF range determined by the faulty scan FF narrowing unit.

13 Claims, 21 Drawing Sheets

PERFORM ONLY FROM NORMAL SCAN CHAIN AT PATH TRACE TIME

FAULTY SCAN BIT RANGE LIMITED BY
PATH TRACE FROM FF2 ON NORMAL SCAN CHAIN

FAULTY SCAN BIT RANGE LIMITED BY
PATH TRACE FROM FF4 ON NORMAL SCAN CHAIN

| EXAMPLE OF ESTIMATION RESULT OUTPUT BY PROPOSED METHOD |
|---|

| No. | CHAIN NAME | FF NO. | FAULT TYPE | SIGNAL LINE (POSITION) | | RATE |
|---|---|---|---|---|---|---|
| 1. | N1 | 10 | stuck-at1 | net1(b2) | net2(b1) | 100/100 |
| 2. | N1 | 11 | stuck-at1 | net2(b2) | net3(b1) | 99/100 |
| 3. | N1 | 12 | stuck-at1 | net3(b2) | net4(b1) | 98/100 |
| 4. | N1 | 13 | stuck-at1 | net4(b2) | | 97/100 |

(b1): AFTER BRANCH
(b2): BEFORE BRANCH

EXAMPLE OF ESTIMATION RESULT OUTPUT BY PROPOSED METHOD
IN WHICH LAYOUT INFORMATION IS ADDED

No. CHAIN NAME  bit NO.     FAULT TYPE     SIGNAL LINE (POSITION)    RATE
    COORDINATES   HIERARCHY NAME
    AGGRESSOR SIGNAL LINE
    COORDINATES   HIERARCHY NAME 1.  N1     10          stuck-at1     net1 ( B2 )         100/100
    (X1, Y1) (X2, Y2) (X3, Y3),  M2 M3 M4
    net2
    (X4, Y4) (X5, Y5),  M3

FIG. 13B  IMAGE OF FAULT LOCATION RANGE INDICATED BY OUTPUT EXAMPLE

RELATED ART

FIG. 19

$$\text{SCORE} = \frac{\text{TFSF}}{\text{TFSF} + \text{TFSP} + \text{TPSF}} \times 100$$

| |
|---|
| TFSF : NUMBER OF SCAN FFS THAT FAILED TEST BY A TESTER AND FAILED FAULT SIMULATION |
| TFSP : NUMBER OF SCAN FFS THAT FAILED TEST BY A TESTER AND PASSED FAULT SIMULATION |
| TPSF : NUMBER OF SCAN FFS THAT PASSED TEST BY A TESTER AND FAILED FAULT SIMULATION |
| TPSP : NUMBER OF SCAN FFS THAT PASSED TEST BY A TESTER AND PASSED FAULT SIMULATION |

| OUTPUT OF PRIOR-ART FAULT LOCATION ESTIMATION DEVICE | | | | |
|---|---|---|---|---|
| No. | CHAIN NAME | FF. NO | FAULT TYPE | RATE |
| 1. | N1 | 10 | stuck-at1 | 100/100 |
| 2. | N1 | 11 | stuck-at1 | 100/100 |
| 3. | N1 | 12 | stuck-at1 | 98/100 |
| 4. | N1 | 13 | stuck-at1 | 97/100 |

US 8,356,218 B2

FAULT LOCATION ESTIMATION DEVICE, FAULT LOCATION ESTIMATION METHOD, AND PROGRAM

TECHNICAL FIELD

Reference to Related Application

This application is based upon and claims the benefit of the priority of Japanese Patent Application No. 2009-141068, filed on Jun. 12, 2009, the disclosure of which is incorporated herein in its entirety by reference thereto.

The present invention relates to a fault location estimation device, a fault location estimation method, and a program for estimating a fault location in a logic circuit, and more particularly to a fault location estimation device, a fault location estimation method, and a program for estimating a fault location on the scan chain of a logic circuit.

BACKGROUND ART

An example of a prior-art fault location estimation method for estimating a fault location on a scan chain (or scan path) of a scan circuit is the fault location estimation device described in Non-Patent Document 1. This fault location estimation device tests a defective circuit, which is a logic circuit found failed in the scan chain operation verification test and recognized as having a single scan chain fault, using a particular test pattern. And, based on the obtained test result, the fault location estimation device narrows the fault range of faulty scan flip-flops (scan FFs) for identifying the fault location by the fault simulation.

First, the following describes the technical terms on a scan circuit and the scan operation with reference to FIG. 14.

FIG. 14 is a diagram showing a scan chain composed of 10 scan FFs. Index numbers are assigned to the scan FFs sequentially beginning at the scan out (Sout) terminal side. In this example, the index numbers 0-9 are assigned. In the scan operation, data flows from the scan-in (Sin) terminal to the scan-out (Sout) terminal.

In FIG. 14, the Sin side of a particular scan FF is called the upstream, and the Sout side is called the downstream. For example, in FIG. 14, there are scan FF6-FF9 in the upstream of scan FF5, and scan FF0-FF4 in the downstream. In this case, the particular scan FF itself is sometimes included in the downstream. Inputting values from the Sin terminal into the scan FFs while shifting through those scan FFs is called 'loading', and outputting values of the scan FFs from the Sout terminal is called 'unloading'.

Loading is also called scan-in or shift-in. And, unloading is also called scan-out or shift-out.

Load data and unload data are represented using the notation method in which the logic values are sequentially written beginning at the value in the scan FF nearest to the Sin terminal. For example, in the notation {00110011}, the left end represents data nearest to the Sin terminal and the right end represents the data nearest to the Sout terminal.

FIG. 15 is a diagram showing a scan circuit that includes one scan chain. The outmost solid line indicates the whole scan circuit, the dotted line within the solid line indicates the scan chain, a small square on the dotted line indicates a scan FF, the rectangular portion surrounded by the dotted line indicates a combinational circuit partitioned by the scan chain. The scan operation is performed in such a way that data is supplied to the scan FFs, beginning at the scan FF on the Sin side, to determine the state values of the scan FFs (this operation is called as the load operation) and, after that, the system clock (or capture clock) is applied to supply data to the combinational circuit (this operation is called the capture operation) and, finally, data is output from the scan FF terminal on the Sout side. By performing this operation, the internal information on the combinational circuit may be obtained. The scan operation is also called a scan test.

The fault diagnosis of a scan circuit is performed based on data obtained by the scan operation described above. Therefore, the fault diagnosis of a scan circuit requires the normal operation of the scan chain that supplies data to the combinational circuit and outputs the result. The present invention relates to a method for isolating a fault location on a scan chain when the scan chain itself is faulty.

One of the ways to confirm the normal operation of a scan chain is a scan chain operation verification test (flush test, scan check). In the scan chain operation verification test, the special patterns such as {000000} {all 0s}, {111111}(all 1s), and {00110011} are used to check the operation of the scan chain.

Next, the following describes in detail a fault location estimation device in the prior art with reference to the drawings. FIG. 16 is a block diagram showing a configuration of the fault location estimation device in the prior art.

Referring to FIG. 16, the fault location estimation device in the prior art includes an input device 1 that has a keyboard and an interface unit for interface with the external system, a data processing device 2 that operates under program control, a storage device 3 such as a hard disk or a memory in which information is stored, and an output device 4 such as a display device or a printer that is an interface unit for interface with the external system.

Referring to FIG. 16, the storage device 3 includes a logic circuit test result information storage unit 41, a faulty scan chain storage unit 42, and a faulty scan FF storage unit 43.

The logic circuit test result information storage unit 41 stores information on the logic state of the signal lines, logic state (expected value) of the signal lines when the circuit is normal, and the scan FFs in which the fail signal was detected in the test (called 'failure-observed scan FF') and, at the same time, stores information on the configuration of the logic circuit (for example, gate type, connection relation between gates, connection relation between gate and signal line, connection relation between signal lines). Here, a node refers to a part configuring the circuit (for example, gate, gate terminal, net, circuit terminal), and a failure observation node refers to a node at which the logic state can be observed (for example, external output terminal of the circuit or scan FF).

The faulty scan chain storage unit 42 stores information on a faulty scan chain and its fault type produced as a result of the analysis of the scan chain operation verification test result.

The faulty scan FF storage unit 43 stores information on the range of faulty scan FFs on a faulty scan chain.

Referring to FIG. 16, the data processing device 2 includes an initialization unit 21, a faulty scan chain identification unit 22, a faulty scan FF narrowing unit 23, and a fault simulation comparison unit 24.

The initialization unit 21 references the logic circuit test result information storage unit 41 to set the logic circuit types and the logic states of the input/output terminals and initialize the logic states of the signal lines.

The faulty scan chain identification unit 22 references the logic circuit test result information storage unit 41 to analyze the scan chain operation verification test result and records a failed scan chain (that is, faulty scan chain) and its fault type in the faulty scan chain storage unit 42.

The faulty scan FF narrowing unit 23 references the logic circuit test result information storage unit 41 and the faulty scan chain storage unit 42, compares the observed value (output value) of scan FFs on the faulty scan chain with the simulation value (expected value) based on the test result, calculates the range of scan FFs in which a fault may be present, and records the calculation result in the faulty scan FF storage unit 43.

The fault simulation comparison unit 24 references the logic circuit test result information storage unit 41, faulty scan chain storage unit 42, and faulty scan FF storage unit 43, performs the fault simulation with a fault type specified for each faulty scan FF, and outputs a scan FF and a fault type that is the best match between the simulation result and the test result.

FIG. 17 is a flowchart showing an operation of the prior-art fault location estimation device that estimates the fault location of a scan chain fault. The following describes the operation of the prior-art fault location estimation device in detail with reference to FIG. 17.

Referring to FIG. 17, the initialization unit 21 references the logic circuit test result information storage unit 41, sets the types of the logic circuits and the logic states of the input/output terminals, and initializes the logic states of the signal lines (step D1).

Next, the faulty scan chain identification unit 22 references the data stored in the logic circuit test result information storage unit 41 to perform the scan chain operation verification test, identifies the scan chain in which a failure-observed scan FF is included, collects the state value of the failure-observed scan FF of each scan chain, determines the fault type of the faulty scan chain whether the fault is a permanent fault or an undefined fault (step D2), and stores the faulty scan chain and the fault type in the faulty scan chain storage unit 42. If there are two or more faulty scan chains or if the fault type of the faulty scan chain is undefined, the diagnosis processing is terminated.

The faulty scan FF narrowing unit 23 references the data, recorded in the logic circuit test result information storage unit 41, to test a defective circuit using a pattern, in which the logic value applied to the faulty scan chain is all undefined value 'X', based on the faulty scan chain information stored in the faulty scan chain storage unit 42. The faulty scan FF narrowing unit 23 compares the observed value of the faulty scan chain, obtained as a result of the test, with the simulation value, calculates a faulty scan FF range from the location of the scan FF at which the two values are different, and records the faulty scan FF range in the faulty scan FF storage unit 43 (step D3).

FIG. 18 is a diagram showing the faulty scan FF isolation method used by the prior-art fault location estimation device. Referring to FIG. 18, the following describes the fault range isolation method for a stuck-at-1 fault as an example of permanent-fault isolation. Because a stuck-at-1 fault is a fault in which the state value is set to '1', a fault is generated if the observed value is '1' when the normal value is '0'. The sensitive bits where a fault may be generated are scan FF3 and FF6. Because the normal value of scan FF5 is '1', the stuck-at-1 fault is not activated. The comparison between the simulation value and the observed value in scan FF3 and scan FF6 indicates that scan FF3 is the normal value and scan FF6 is the fault value. This implies that the stuck-at-1 fault is present in the upstream of scan FF3 and in the down stream of scan FF6. In this case, scan FF6 is called the upstream bound (UB) and scan FF3 is called the downstream bound (LB).

To detect a transition fault and a hold time fault, the state values of the two neighboring scan FFs are considered. For example, when a slow-to-fall fault is generated, the possible location at which the slow-to-fall failure is generated in FIG. 18 is between scan FF2 and scan FF3 and between scan FF5 and scan FF6 where the value changes from 1 to 0. The observed value and the simulation value match between scan FF2 and scan FF3. On the other hand, the observed value and the simulation value do not match between scan FF5 and scan FF6 because the observed value of scan FF6 is '1', meaning that a failure is observed and that a slow-to-fall fault is generated. Therefore, the upstream bound of the slow-to-fall fault is scan FF5, and the downstream bound is scan FF2.

Finally, the fault simulation comparison unit 24 references the logic circuit test result information storage unit 41 to set the logic values of the signal lines, references the faulty scan chain storage unit 42 and the faulty scan FF storage unit 43 to set the fault type for each scan FF in the faulty scan FF range, performs the fault simulation, and outputs a scan FF, which is the best match (highest score) between the simulation result and the test result, to the output device 4 as the faulty scan FF candidate (step D4).

Now, referring to FIG. 19, the following describes how to calculate the score. To calculate the score, the following four elements shown in FIG. 19 are used.

TFSF: Number of scan FFs that failed test by a tester and failed fault simulation TFSP: Number of scan FFs that failed test by a tester and passed fault simulation TPSF: Number of scan FFs that passed test by a tester and failed fault simulation TPSP: Number of scan FFs that passed test by a tester and passed fault simulation The calculation expression shown in FIG. 19 is a general calculation expression for calculating the score. When the result values of the fault simulation and the observed value of the tester completely match, the relation TFSP=TPSF=0 is satisfied and the score of the calculation expression in FIG. 19 becomes the maximum value of 100.

The prior-art fault location estimation device compares the fault-affected observed value generated at unload time with the simulation value and calculates the fault range. However, when an undefined fault is generated, a fault is more likely to occur randomly whether the value is '0' or '1'. Therefore, the most downstream failure that is observed cannot be determined as the first failure with the result that the faulty scan FF range cannot be identified.

In addition, if the same logic value as that of a fault value is continuously observed on the downstream side beginning at a faulty scan FF, the isolation range becomes wide. In this case, the problem is that the need to perform fault simulation for a wide range of faulty scan FFs prevents the diagnosis from being terminated within a practical time.

FIG. 20 is a diagram showing an example of the actual operation of the faulty scan FF narrowing unit 23 in the prior-art fault location estimation device. Referring to FIG. 20, all observed value of the scan FFs in the scan chain on the upstream side of the faulty scan FF, indicated by the dotted arrow, are the same as the fault value '1'. As a result, the prior-art fault location estimation device cannot limit the faulty scan FF range, because those scan FFs are also considered as equivalent faulty scan FF candidates. In addition, if the observed value of one or more scan FFs in the scan chain on the downstream side of the faulty scan FF, indicated by the dotted arrow, are continuously the same logical value as that of the faulty scan FF, the scan FFs included in that range may be faulty and so the range of the faulty scan FFs becomes even wider.

In addition, when the fault simulation is performed, the prior art assumes a fault in the scan FFs with no consideration for a signal line branch point between FFs. This decreases both fault simulation accuracy and diagnosis accuracy.

FIGS. 21A and 21B are diagrams showing an example of the output of the scan chain fault diagnosis result obtained by the prior-art fault location estimation device. The prior-art fault location estimation device, which performs the fault simulation assuming that a fault is generated in scan FFs, outputs the scan chain name, scan FF number, fault type, and matching rate (rate) as the output content as shown in FIG. 21A. However, as indicated by the dotted arrows in FIG. 21B, the range of a fault candidate indicated by this output result extends over two signal lines on both sides of a fault candidate scan FF. And, on one signal line that has a branch point, no consideration is given to a change in the failure propagation path caused by the branch. This requires the user of the prior-art fault location estimation device to manually verify a location at which a fault is likely to occur.

[Non-Patent Document 1]
R. Guo et al., "A Technique for Fault Diagnosis of Defects in Scan Chains," ITC (International Test Conference), 2001, pp. 268-277

[Non-Patent Document 2]
K. Stanley, "High-Accuracy Flush-and-Scan Software Diagnostic," IEEE Design & Test of Computers, 2001, Vol. 18, No. 6, pp. 56-62

[Non-Patent Document 3]
Yu Huang et al., "Using Fault Model Relaxation to Diagnose Real Scan Chain Defects," ASP-DAC, 2005, pp. 1176-1179

SUMMARY

The entire disclosure of Non-Patent Documents 1-3 are incorporated herein by reference thereto.
The prior-art fault location estimation device has the following problems.

A first problem is that the prior-art fault location estimation device is not applicable to an undefined fault.

The reason is as follows. The prior-art fault location estimation device compares the observed value of the most-downstream failed scan FF generated at unload time and its neighboring scan FFs with the simulation value to limit the faulty scan FF range and, in addition, performs fault simulation to further narrow the faulty scan FF. However, an undefined fault, which tends to be randomly activated, decreases the reliability of the failure observation at unload time, making it impossible to narrow the faulty scan FF range. Failure to narrow the faulty scan FF range extends the scan FF range, for which fault simulation is to be performed, and prevents the diagnosis from being terminated within a practical period of time.

A second problem is that the prior-art fault location estimation device is sometimes not applicable to a permanent fault.

The reason is as follows. The prior-art fault location estimation device compares the observed value of the most-downstream failed scan FF generated at unload time and its neighboring scan FFs with the simulation value to limit the faulty scan FF range and, in addition, performs fault simulation to further narrow the faulty scan FF. However, if the same value as the fault value continuously occurs in the simulation value of the scan FFs near the faulty scan FF, the most-downstream failed scan FF cannot be determined and therefore the faulty scan FF range cannot be narrowed. Failure to narrow the faulty scan FF range extends the scan FF range, for which fault simulation is to be performed, and prevents the diagnosis from being terminated within a practical period of time.

A third problem is that multiple signal lines are included in a fault range indicated by one fault candidate generated by the prior-art fault location estimation device. Therefore, the actual analysis requires the user to further narrow the fault locations.

The reason is that the prior-art fault location estimation device assumes a fault in the scan FFs when fault simulation is performed. That is, even if there are multiple signal lines between scan FFs, those signal lines connected to the same faulty scan FF are considered as one fault candidate both before and after the branch point. Therefore, the user must check the range of fault candidates again.

In view of the foregoing, there is a need in the art to increase the accuracy of fault diagnosis of a scan chain. There is also a need to provide a fault location estimation device, a fault location estimation method, and a program for solving the problems described above.

In a first aspect of the present invention, there is provided a fault location estimation device, which comprises:
a faulty scan chain identification unit that identifies a faulty scan chain and a fault type thereof based on a result of a scan chain operation verification test;
a faulty scan FF narrowing unit that compares a test result (observed value) of a faulty scan chain of a defective circuit with a simulation result for determining a faulty scan FF range beginning at a location of a scan FF where both results differ; and
a path trace narrowing unit that references logic circuit configuration information, a signal line expected value, a failure-observed scan FF, and a test result of a defective circuit to extract a scan FF on the faulty scan chain, which may be reached from a failure-observed scan FF observed on a normal scan chain by tracing back a failure-propagation path while performing an implication procedure for an input side and, based on the position of the extracted scan FF on the scan chain, determines a faulty scan FF range for further narrowing the faulty scan FF range determined by the faulty scan FF narrowing unit.

In a second aspect of the present invention, there is provided a fault location estimation device that narrows a range, where a possibility of a fault on a faulty scan chain is high, based on failure-observed scan FF information acquired from a test result of a logic circuit, the fault location estimation device includes:
a faulty scan chain identification unit that references logic circuit configuration information, a signal line expected value, and a test result of a scan chain operation verification test, which are stored in a logic circuit test result information storage unit, to determine a number of faulty scan chains and a fault type thereof and, for a test result of a fault determined to be a single scan chain fault, records a faulty scan chain in the logic circuit and the fault type in a faulty scan chain storage unit;
a faulty scan FF narrowing unit that references test results of a non-defective circuit and a defective circuit, using the faulty scan chain and the fault type recorded in the faulty scan chain storage unit, to determine a faulty scan FF range based on a difference in an output value on the faulty scan chain between the test result of the non-defective circuit and the test result of the defective circuit, and records the faulty scan FF range in a faulty scan FF storage unit;
a path trace narrowing unit that references the faulty scan chain recorded in the faulty scan chain storage unit, references failure-observed scan FF information, which is obtained by inputting after a scan load operation a test pattern that is a combination of set/reset operation, a shift operation, and a capture operation, and the logic circuit configuration information and the signal line expected value, which are stored in the logic circuit test result information storage unit, to extract a scan FF on the faulty scan chain that is reached when a path is traced from the failure-observed scan FF while making an estimation in implication mode, further narrows the faulty scan FF range based on a position relation of the extracted scan FF, and records the narrowed faulty scan FF range again in the faulty scan FF storage unit; and an output unit that outputs the faulty scan chain, the faulty scan FF, and the fault type.

In a third aspect of the present invention, there is provided a fault location estimation method which comprises:

identifying a faulty scan chain and a fault type thereof based on a result of a scan chain operation verification test;

comparing a test result (observed value) of a faulty scan chain of a defective circuit with a simulation result for determining a faulty scan FF range beginning at a location of a scan FF where both results differ; and referencing logic circuit configuration information, a signal line expected value, a failure-observed scan FF, and a test result of a defective circuit to extract a scan FF on the faulty scan chain, which may be reached from a failure-observed scan FF observed on a normal scan chain by tracing back a failure-propagation path while performing an implication procedure for an input side and, based on the position of the extracted scan FF on the scan chain, determines a faulty scan FF range for further narrowing the faulty scan FF range determined by the comparing.

In a fourth aspect of the present invention, there is provided a program that causes a computer to execute:

identifying a faulty scan chain and a fault type thereof based on a result of a scan chain operation verification test;

comparing a test result (observed value) of a faulty scan chain of a defective circuit with a simulation result for determining a faulty scan FF range beginning at a location of a scan FF where both results differ; and referencing logic circuit configuration information, a signal line expected value, a failure-observed scan FF, and a test result of a defective circuit to extract a scan FF on the faulty scan chain, which may be reached from a failure-observed scan FF observed on a normal scan chain by tracing back a failure-propagation path while performing an implication procedure for an input side and, based on the position of the extracted scan FF on the scan chain, determines a faulty scan FF range for further narrowing the faulty scan FF range determined by the comparing.

The present invention provides the following advantage, but not restricted thereto. The fault location estimation device, the fault location estimation method, and the program of the present invention increase the accuracy in the fault diagnosis of a scan chain.

BRIEF DESCRIPTION OF THE DRAWINGS

FIGS. 13A and 13B are diagrams showing an example of diagnosis result and fault range of a fault location estimation device in a second exemplary embodiment.

FIG. 19 is a diagram showing a calculation expression used by a prior-art fault location estimation device for calculating a score.

PREFERRED MODES

Figure 1:
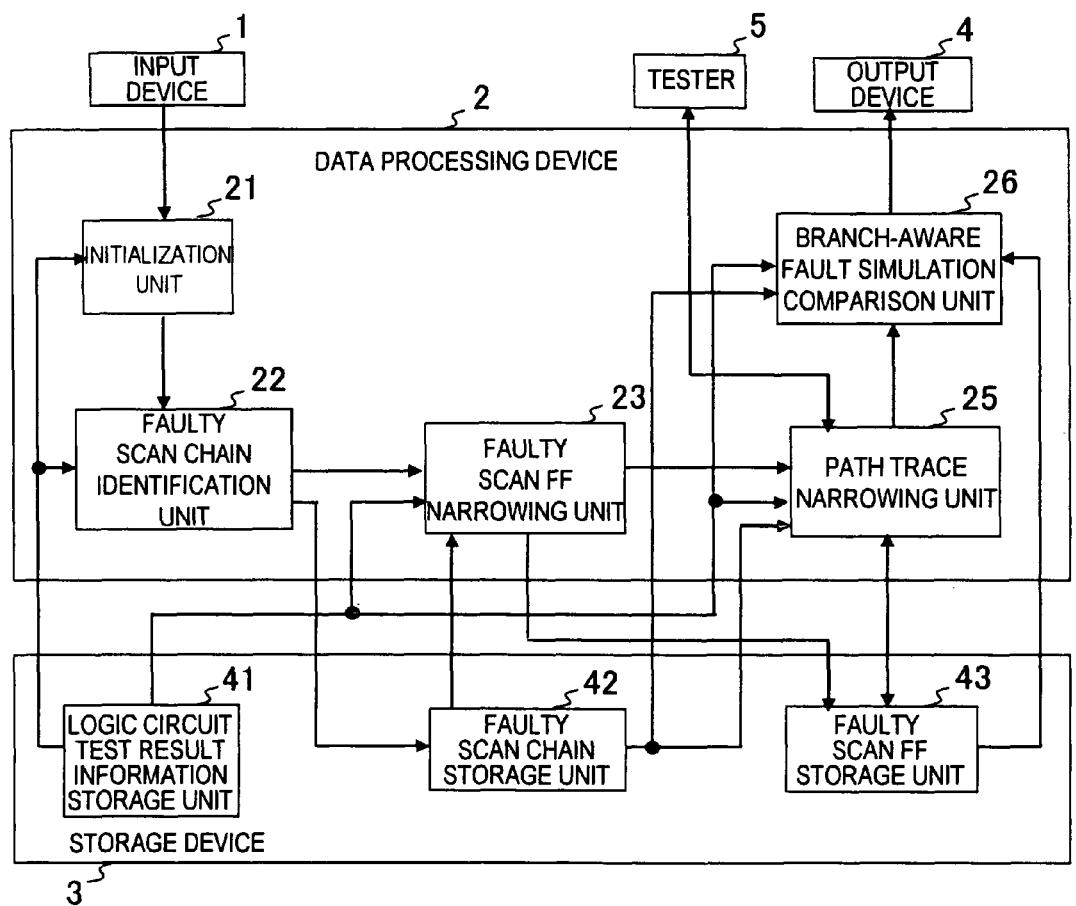
FIG. 1 is a block diagram showing a configuration of a fault location estimation device in a first exemplary embodiment.

In the present disclosure, there are various possible modes, which include the following, but not restricted thereto.

Preferably, a fault location estimation device in a first mode is the fault location estimation device in the first aspect described above.

Preferably, the fault location estimation device in a second mode further includes: a branch-aware fault simulation comparison unit that references the logic circuit configuration information, the signal line expected value, faulty scan chain information, and faulty scan FF range and, if a signal line between scan FFs branches, distinguishes between fault candidates before and after a branch point, assumes a fault for each fault candidate, performs scan chain fault simulation, compares the fault simulation result with the test result of the defective circuit, and outputs a highest matching rate scan FF, as well as a signal line and a fault type thereof, as a fault candidate.

Preferably, in the fault location estimation device in a third mode, the faulty scan chain identification unit identifies the faulty scan chain and the fault type thereof assuming that a fault is present on a single scan chain in a scan circuit.

Preferably, in the fault location estimation device in a fourth mode, the faulty scan FF narrowing unit performs the test at a defective circuit test time using a pattern in which all logical values applied to the faulty scan chain are an undefined value.

Preferably, in the fault location estimation device in a fifth mode, the path trace narrowing unit determines a part, which is common to the determined faulty scan FF range and the faulty scan FF range determined by the faulty scan FF narrowing unit, as a new faulty scan FF range.

Preferably, a fault location estimation device in a sixth mode is the fault location estimation device in the second aspect described above.

Preferably, in the fault location estimation device in a seventh mode, the path trace narrowing unit references the faulty scan chain recorded in the faulty scan chain storage unit, references the failure-observed scan FF information, which is detected first when an internal logic is determined by repeatedly inputting, after inputting an undefined value into the faulty scan chain at scan load operation time, a test pattern that is a combination of the shift operation and the capture operation, and references the logic circuit configuration information and the signal line expected value, which are recorded in the logic circuit test result information storage unit, to extract a scan FF on the faulty scan chain that is reached when a path is traced from the failure-observed scan FF while making an estimation in implication mode, further narrows the faulty scan FF range based on a position relation of the extracted scan FF, and records the narrowed faulty scan FF range again in the faulty scan FF storage unit.

Preferably, the fault location estimation device in an eighth mode further includes a branch-aware fault simulation comparison unit that references the logic circuit test result information storage unit, the faulty scan chain storage unit, and the faulty scan FF storage unit to reference the logic circuit configuration, the signal line expected value, faulty scan chain, faulty scan FF range, and the fault-type of the faulty scan chain, performs a scan chain fault simulation for a signal line between FFs in the faulty scan FF range considering a branch state of the signal line, and compares the simulation result with the test result to output a signal line having a high rate of matching between the simulation result and the test result; and wherein
the output unit further outputs a faulty signal line and the faulty branch position of the faulty signal line.

Preferably, the fault location estimation device in a ninth mode further includes a fault candidate layout search comparison unit that references the faulty scan chain, faulty scan FF, fault type, faulty signal line, and the branch position of the faulty signal line output by the output unit and, at the same time, references the logic circuit configuration, the signal line expected value, and layout information on the logic circuit which are stored in the logic circuit test result information storage unit, searches for coordinate information on the faulty signal line, displays a layout from the coordinate information, calculates a hierarchy of the fault location from the fault branch position of the faulty signal line, calculates neighboring signal lines from the layout information, calculates an aggressor signal lines through comparison with the expected value information, and outputs layout information on the fault location, and wherein the output unit further outputs the layout of the fault location, the coordinate information on the fault location, the name of a hierarchy in which the fault is likely to be present, and the aggressor signal line name.

Preferably, a fault location estimation method in a tenth mode is the fault location estimation method in the third aspect described above.

Preferably, the fault location estimation method in an eleventh mode further includes: referencing the logic circuit configuration information, the signal line expected value, faulty scan chain information, and faulty scan FF range and, if a signal line between scan FFs branches, distinguishing between fault candidates before and after a branch point, assuming a fault for each fault candidate, performing scan chain fault simulation, comparing the fault simulation result with the test result of the defective circuit, and outputting a highest matching rate scan FF, as well as a signal line and a fault type thereof, as a fault candidate.

Preferably, in the fault location estimation method in a twelfth mode, the comparing includes: performing the test at a defective circuit test time using a pattern in which all logical values applied to the faulty scan chain are an undefined value.

Preferably, in the fault location estimation method in a thirteenth mode, the referencing includes determining a part, which is common to the determined faulty scan FF range and the faulty scan FF range determined by the comparing, as a new faulty scan FF range.

Preferably, a program in a fourteenth mode is the program in the fourth aspect described above.

Preferably, the program in a fifteenth mode further causes the computer to execute referencing the logic circuit configuration information, the signal line expected value, faulty scan chain information, and faulty scan FF range and, if a signal line between scan FFs branches, distinguishing between fault candidates before and after a branch point, assuming a fault for each fault candidate, performing scan chain fault simulation, comparing the fault simulation result with the test result of the defective circuit, and outputting a highest matching rate scan FF, as well as a signal line and a fault type thereof, as a fault candidate.

Preferably, in the program in a sixteenth mode, the comparing includes performing the test at a defective circuit test time using a pattern in which all logical values applied to the faulty scan chain are an undefined value.

Preferably, in the program in a seventeenth mode, the referencing includes determining a part, which is common to the determined faulty scan FF range and the faulty scan FF range determined by the comparing, as a new faulty scan FF range.

(First Exemplary Embodiment)

A fault location estimation device in a first exemplary embodiment of the present invention identifies a faulty scan chain and its fault type using the result of the scan chain operation verification test, calculates a range of faulty scan FFs by comparing the faulty scan chain test result and the simulation result of a defective circuit, traces back the failure-propagation path, beginning at a failure observed on the normal scan chain of the defective circuit while performing the implication procedure for the input side, to calculate a faulty scan FF to which the failure is propagated for further limiting the range of the faulty scan FF range, performs the scan chain fault simulation for each scan FF considering a signal line between scan FFs and its branches, and outputs the test result and the comparison result.

FIG. 1 is a block diagram showing the configuration of the fault location estimation, device in the present exemplary embodiment. Referring to FIG. 1, the fault location estimation device includes an input device 1, a data processing device 2, a storage device 3, an output device 4, and a tester 5. In addition, the data processing device 2 includes an initialization unit 21, a faulty scan chain identification unit 22, a faulty scan FF narrowing unit 23, a path trace narrowing unit 25, and a branch-aware fault simulation comparison unit 26. The initialization unit 21 sets the logic circuit types and the logic states of the input/output terminals and initializes the logic states of the signal lines.

The faulty scan chain identification unit 22 identifies a faulty scan chain and its fault type from the result of the scan chain operation verification test assuming that there is a fault on a single scan chain in the scan circuit, and records the faulty scan chain and the fault type as the faulty scan information.

The faulty scan FF narrowing unit 23 performs a test, at defective circuit test time, using a pattern in which the undefined value 'X' is used as the logical value applied to all scan FFs in the faulty scan chain, compares the test result (observed value) of the faulty scan chain of the defective circuit with the simulation result, finds a faulty scan FF range based on the scan FF location at which the results differ, and records the range as a faulty scan FF range.

The path trace narrowing unit 25 references the logic circuit configuration information, the signal line expected value, failure-observed scan FFs, and defective circuit test result to extract a scan FF on the faulty scan chain, which may be reached from a failure-observed scan FF observed on a normal scan chain, by tracing back the failure-propagation path while performing the implication procedure for the input side and, based on the location of the extracted scan FF on the scan chain, determines the faulty scan FF range. The path trace narrowing unit 25 records a part, common to the faulty scan FF range obtained in this way and the faulty scan FF range obtained by the faulty scan FF narrowing unit 23, in the faulty scan FF storage unit 43 as a new faulty scan FF range.

The branch-aware fault simulation comparison unit 26 references the logic circuit configuration information, the signal line expected value, faulty scan chain information, and faulty scan FF range and, if the signal line between scan FFs branches, distinguishes between the fault candidates before and after the branch point. On the assumption that each fault candidate may cause a fault, the branch-aware fault simulation comparison unit 26 performs the scan chain fault simulation, compares the fault simulation result and the defective circuit test result, and outputs the highest matching rate scan FF, the signal line, and the fault type as a fault candidate.

The fault location estimation device, which has the configuration described above, performs the scan chain operation verification test to identify a faulty scan chain and its fault type. In addition, based on the comparison between the observed value of the defective circuit test result and the simulation value and based on the result of the path trace from a failure-observed scan FF on a normal scan chain of the defective circuit, the fault location estimation device narrows the faulty scan FF range, compares the scan chain fault simulation result with the test result considering signal lines and branch points between scan FFs, and outputs the comparison result.

Based on the configuration described above, the fault location estimation device achieves the object of the present invention by estimating a location at which a fault is activated on the scan chain.

The fault location estimation device in the present exemplary embodiment can estimate a fault location for both types of fault, permanent fault and undefined fault, on a scan chain.

The following describes the reason with reference to FIGS. 7A-7F. By applying multiple patterns in which the shift operation and the capture operation are repeated arbitrarily after the load operation, the fault location estimation device in the present exemplary embodiment activates an undefined fault and gives information on a scan FF to which a failure is propagated first on a normal scan chain with the state values of the internal nodes of the circuit determined. Therefore, because the diagnosis is performed using the test result with a failure always activated, even an undefined fault can be diagnosed.

The fault location estimation device in the present exemplary embodiment performs the fault diagnosis of a permanent fault on a scan chain quicker than the prior-art fault location estimation device.

The reason is that the fault location estimation device in the present exemplary embodiment uses the path trace method for isolating a faulty scan FF range, while estimating the state values in a logic circuit by the implication procedure, thereby eliminating in advance the scan FFs that are included in the faulty scan FF range in the prior art but that do not propagate a fault to a normal scan chain. As a result, the fault location estimation device in the present exemplary embodiment decreases the number of fault simulations and reduces the diagnosis time.

The fault location estimation device in the present exemplary embodiment indicates the location of a fault on the scan chain more accurately than the fault location estimation device in the prior art.

The reason is that the fault location estimation device in the present exemplary embodiment calculates the scores of the signal lines between scan FFs separately before and after each branch point as separate fault candidates to distinguish between them, thus increasing the diagnosis accuracy of a fault area that is duplicated between the fault candidates in the prior-art fault location estimation device.

The fault location estimation device in the present exemplary embodiment limits a fault range, indicated by the diagnosis result, more accurately than the prior-art fault location estimation device and so supports the actual analysis more effectively.

The reason is that the fault location estimation device in the present exemplary embodiment calculates the scores of the signal lines between scan FFs separately before and after each branch point as separate fault candidates to distinguish between them, thus eliminating the need for the investigation of a fault area that is duplicated between the fault candidates in the prior-art fault location estimation device.

The following describes more in detail the fault location estimation device in the present exemplary embodiment with reference to the drawings.

Referring to FIG. 1, the input device 1 has a keyboard and an interface unit that functions as the interface with the external system. The data processing device 2 operates under program control. The storage device 3 is a device, such as a hard disk or a memory, in which information is stored. The output device 4 is a display device, a printer, and so on that functions as the interfaces with the external system. The tester 5 is a tester used to test a defective circuit.

Referring to FIG. 1, the storage device 3 includes the logic circuit test result information storage unit 41, faulty scan chain storage unit 42, and faulty scan FF storage unit 43.

The logic circuit test result information storage unit 41 stores information on the logic states of the signal lines being processed, the logic states of the signal lines when the circuit is normal (that is, expected value), and the failure-observed scan FFs that are found failed as a result of the test and, at the same time, stores information on the configuration of logic circuits on the path (for example, gate type, connection relation between gates, connection relation between gates and signal lines, connection relation between signal lines). Here, a node refers to a part configuring the circuit (for example, gate, gate terminal, net, circuit terminal), and a failure observation node refers to a node at which the logic state can be observed (for example, external output terminal of the circuit and scan FF).

The faulty scan chain storage unit 42 stores information on a faulty scan chain and its fault type produced as a result of the analysis of the scan chain operation verification test result.

The faulty scan FF storage unit 43 stores information on a range of faulty scan FFs on a faulty scan chain.

Referring to FIG. 1, the data processing device 2 includes the initialization unit 21, the faulty scan chain identification unit 22, the faulty scan FF narrowing unit 23, the path trace narrowing unit 25, and the branch-aware fault simulation comparison unit 26.

The initialization unit 21 references the logic circuit test result information storage unit 41 to set the logic circuit types and the logic states of the input/output terminals and initializes the logic states of the signal lines.

The faulty scan chain identification unit 22 references the logic circuit test result information storage unit 41 to analyze the scan chain operation verification test result and stores a failed scan chain (that is, faulty scan chain) and its fault type in the faulty scan chain storage unit 42.

The faulty scan FF narrowing unit 23 references the logic circuit test result information storage unit 41 and the faulty scan chain storage unit 42, compares the observed value (output value) of each scan FF on the faulty scan chain, obtained from the test result, with the simulation value (expected value), calculates the range of scan FFs that may be faulty, and records the calculated range in the faulty scan FF storage unit 43.

The path trace narrowing unit 25 references the logic circuit configuration information, the signal line expected value information, and failure-observed scan FFs recorded in the logic circuit test result information storage unit 41 and, based on the result produced by the test made by the tester 5, extracts a scan FF on the faulty scan chain that will be reached by tracing back the failure-propagation path beginning at a failure-observed scan FF observed on the normal scan chain while performing the implication procedure for the input side and determines the faulty scan FF range based on the position relation of the extracted scan FF on the scan chain. The path trace narrowing unit 25 records a part, common to the faulty scan FF range obtained in this way and the faulty scan FF range obtained by the faulty scan FF narrowing unit 23, in the faulty scan FF storage unit 43 as a new faulty scan FF range.

The branch-aware fault simulation comparison unit 26 references the logic circuit test result information storage unit 41, faulty scan chain storage unit 42, and faulty scan FF storage unit 43 and, for a faulty scan FF range, distinguishes among the signal lines between scan FFs before and after each branch point. The branch-aware fault simulation comparison unit 26 performs the fault simulation for each of the signal lines, compares the simulation result with the test result, and outputs the highest matching rate fault candidate to the output device 4.

Figure 3:
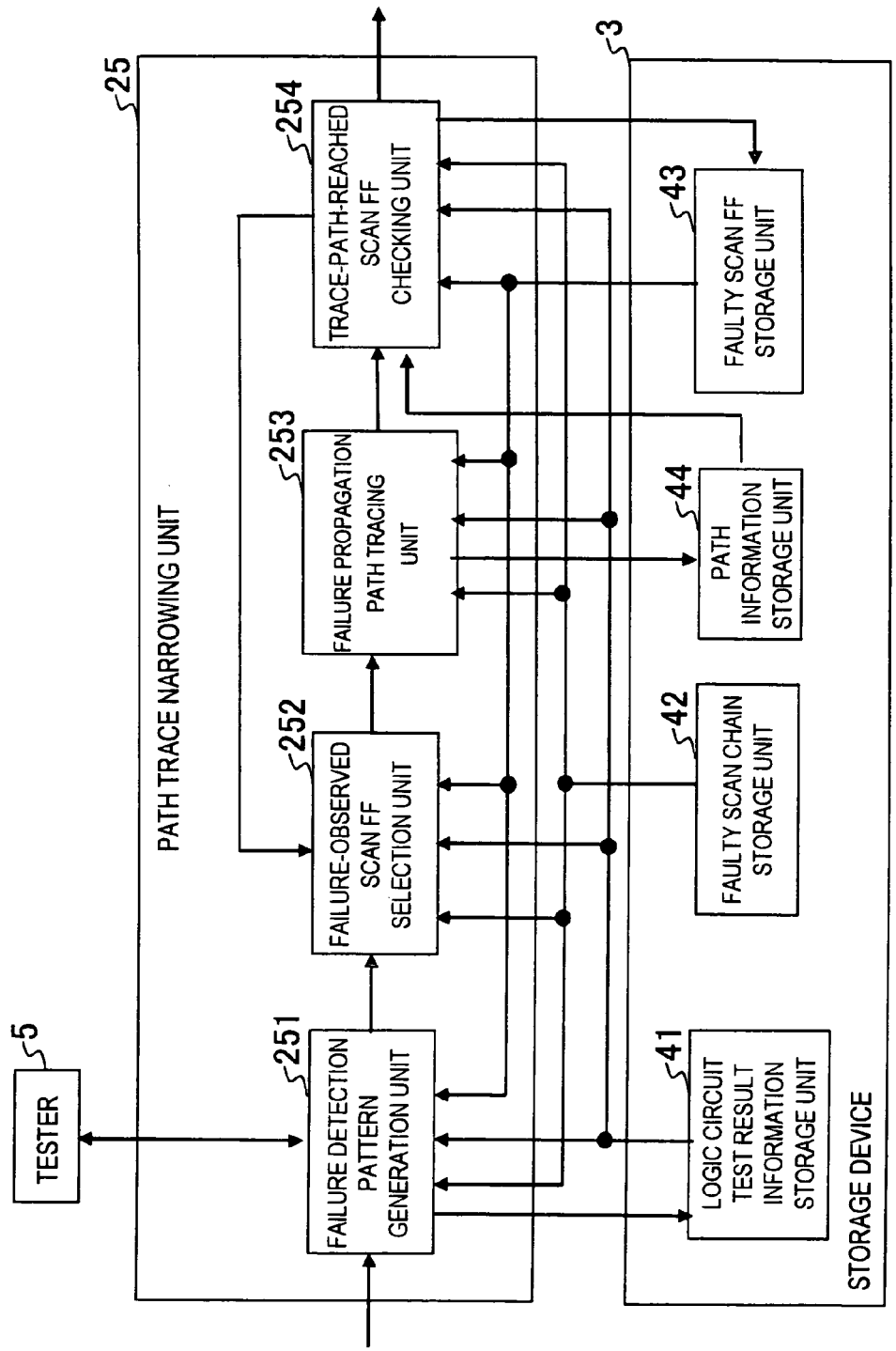
FIG. 3 is a block diagram showing a configuration of a path trace narrowing unit of a fault location estimation device in a first exemplary embodiment.

FIG. 3 is a block diagram showing the detailed configuration of the path trace narrowing unit 25 shown in FIG. 1. The following describes the path trace narrowing unit 25 with reference to FIG. 3.

Referring to FIG. 3, the path trace narrowing unit 25 includes a failure detection pattern generation unit 251, a failure-observed scan FF selection unit 252, a failure-propagation path tracing unit 253, and a trace-path-reached scan FF checking unit 254.

The failure detection pattern generation unit 251 references the logic circuit test result information storage unit 41 and the faulty scan chain storage unit 42, generates a test pattern, which does not activate a failure during the load operation on a faulty scan chain and, in addition, propagates a failure from a faulty scan FF to the normal scan chain during the capture operation, performs the test as needed via the tester 5, and records the test result in the logic circuit test result information storage unit 41.

The failure-observed scan FF selection unit 252 references the logic circuit test result information storage unit 41 and the faulty scan chain storage unit 42 to select an arbitrary failure observation vector and extracts the failure-observed scan FFs of the selected vector.

The failure-propagation path tracing unit 253 references the logic circuit test result information storage unit 41 and the faulty scan chain storage unit 42 to trace back the failure-propagation path beginning at each failure-observed scan FF, while performing the implication procedure for the input side, for acquiring the path information and records the acquired path information in a path information storage unit 44.

The trace-path-reached scan FF checking unit 254 references the logic circuit test result information storage unit 41, faulty scan chain storage unit 42, faulty scan FF storage unit 43, and path information storage unit 44 to calculate a scan FF, to which the failure may be propagated, based on the faulty scan chain information and the path information, compares the calculated result with the existing faulty scan FF range to further narrow the faulty scan FF range, and records the narrowed faulty scan FF range in the faulty scan FF storage unit.

Next, the trace-path-reached scan FF checking unit 254 references the logic circuit test result information storage unit 41 and, if there is an unselected failure-observed scan FF, passes control back to the failure-observed scan FF selection unit 252.

Figure 5:
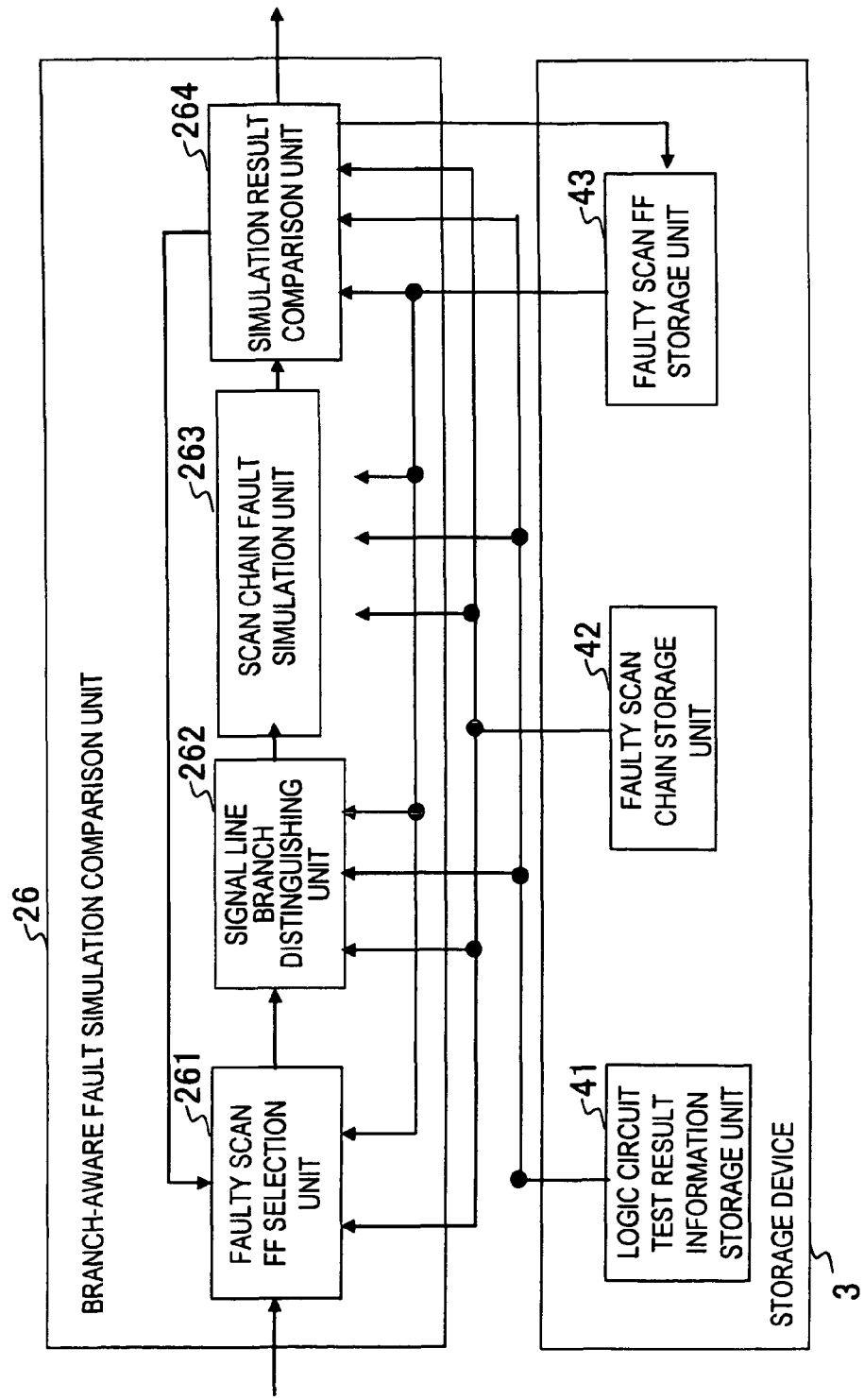
FIG. 5 is a block diagram showing a configuration of a branch-aware fault simulation comparison unit of a fault location estimation device in a first exemplary embodiment.

FIG. 5 is a block diagram showing the detailed configuration of the branch-aware fault simulation comparison unit 26 shown in FIG. 1. Referring to FIG. 5, the following describes the branch-aware fault simulation comparison unit 26.

Referring to FIG. 5, the branch-aware fault simulation comparison unit 26 includes a faulty scan FF selection unit 261, a signal line branch distinguishing unit 262, a scan chain fault simulation unit 263, and a simulation result comparison unit 264.

The faulty scan FF selection unit 261 references the faulty scan chain stored in the faulty scan chain storage unit 42 and the faulty scan FF range stored in the faulty scan FF storage unit 43 to select a fault-assumed scan FF for which the scan chain fault simulation is to be performed.

The signal line branch distinguishing unit 262 references the logic circuit test result information storage unit 41 to distinguish among the signal lines between the scan output of the fault-assumed scan FF and its downstream scan FF based on the branch points.

The scan chain fault simulation unit 263 references the logic circuit test result information storage unit 41 and the fault type recorded in the faulty scan chain storage unit 42, assumes a fault for each of the signal lines that are considered to have a branch, and performs the scan chain fault simulation.

The simulation result comparison unit 264 compares the scan chain fault simulation result with the test result recorded in the logic circuit test result information storage unit 41 and calculates their matching rates. The simulation result comparison unit 264 determines the highest matching rate signal line as a fault candidate. It is also possible to set a predetermined threshold for outputting a match/mismatch determination result or that the matching rate is output as the degree of fault possibility.

Next, the simulation result comparison unit 264 references the faulty scan FF storage unit 43 and, if there is an unselected scan FF, passes control back to the processing of the faulty scan FF selection unit 261.

Figure 2:
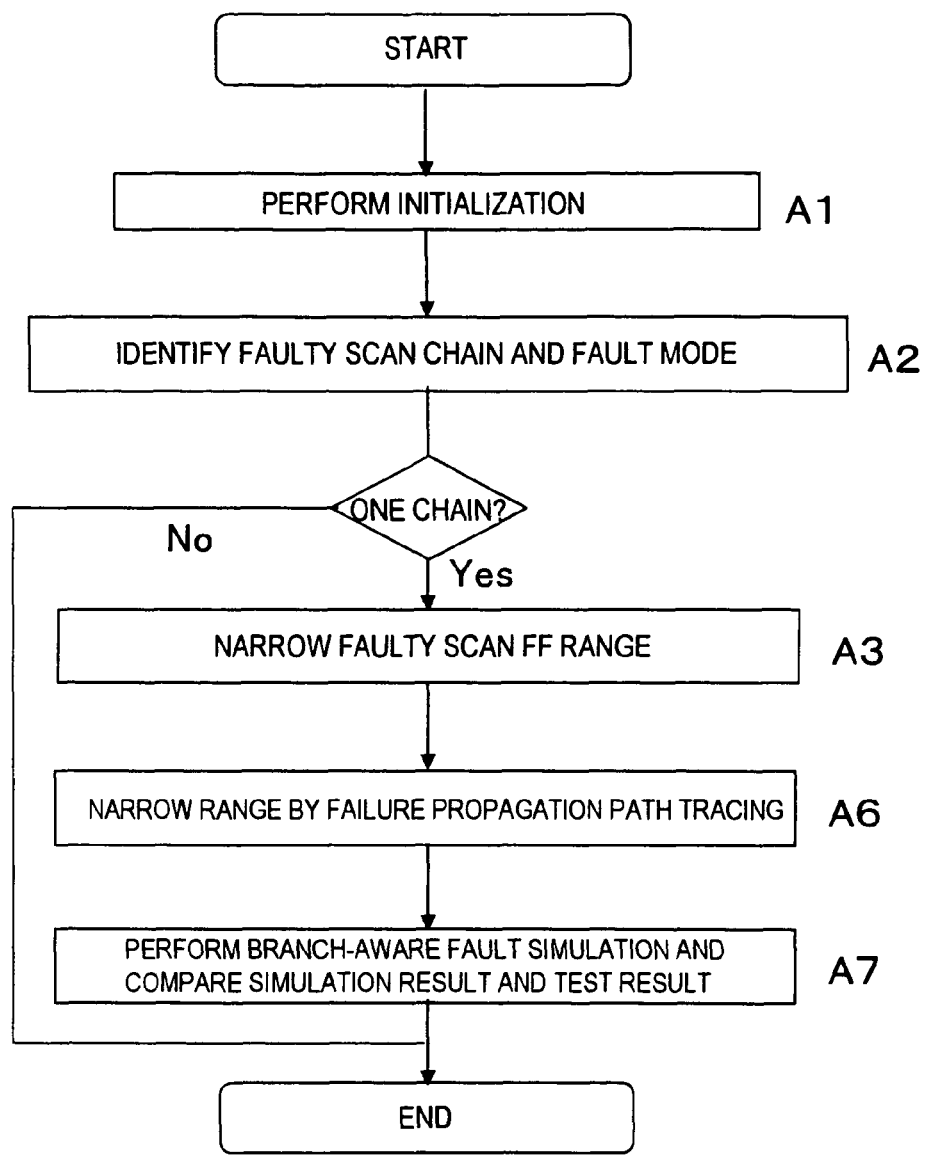
FIG. 2 is a flowchart showing an operation of a fault location estimation device in the first exemplary embodiment.
Figure 4:
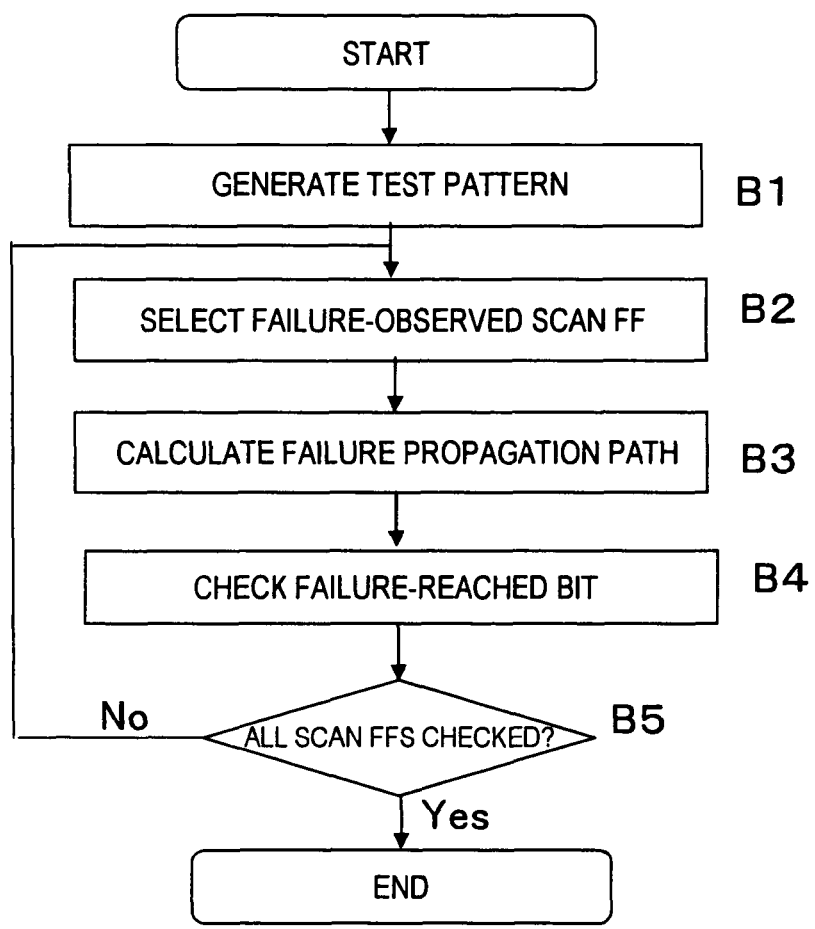
FIG. 4 is a flowchart showing an operation of a path trace narrowing unit of the fault location estimation device in a first exemplary embodiment.
Figure 6:
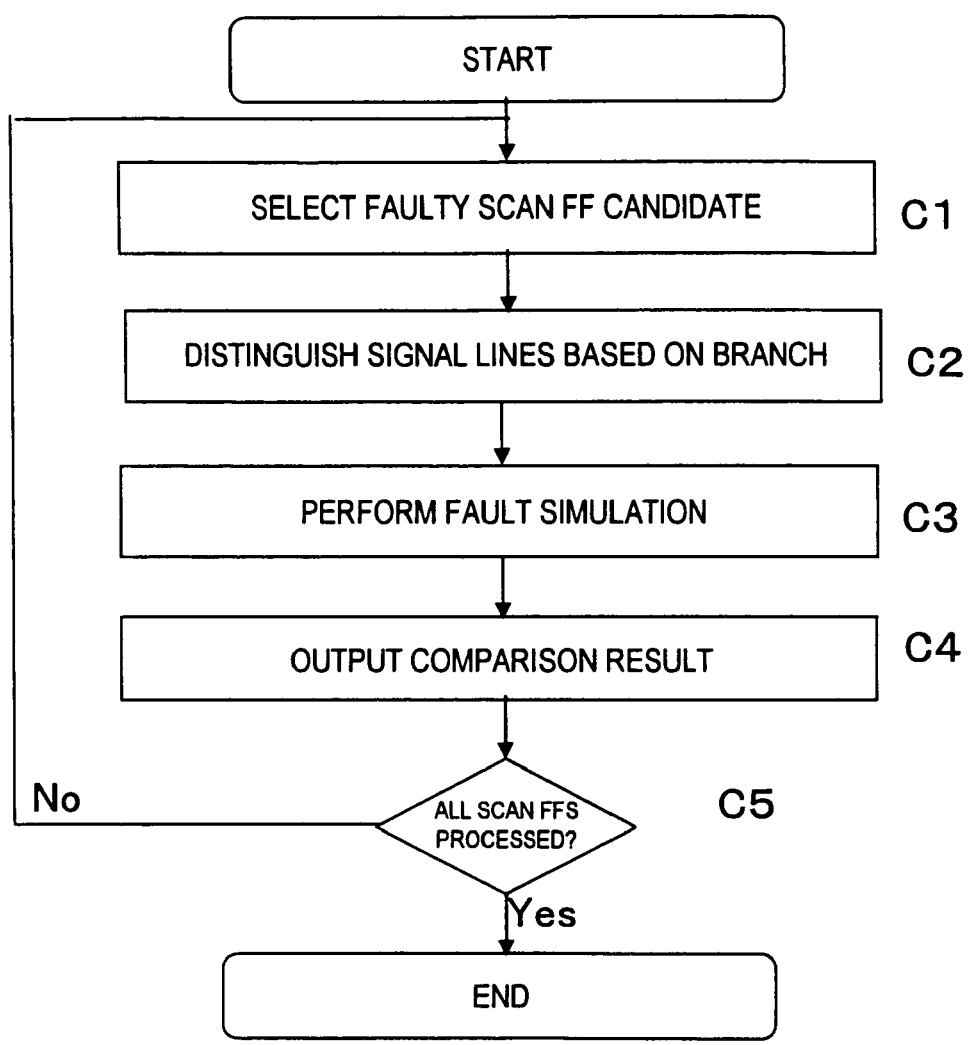
FIG. 6 is a flowchart showing an operation of a branch-aware fault simulation comparison unit of a fault location estimation device in a first exemplary embodiment.

FIG. 2, FIG. 4, and FIG. 6 are flowcharts showing the operation of the fault location estimation device in the present exemplary embodiment. Referring to FIG. 1 to FIG. 6, the operation of the fault location estimation device in the present exemplary embodiment will be described in detail.

Referring to FIG. 1 and FIG. 2, the initialization unit 21 references the logic circuit test result information storage unit 41 to set the types of the logic circuits and the logic states of the input/output terminals for initializing the logic states of the signal lines (step A1).

The faulty scan chain identification unit 22 references the logic circuit test result information storage unit 41 to analyze the scan chain operation verification test result and records the failed scan chain (that is, faulty scan chain) and its fault type in the faulty scan chain storage unit 42 (step A2).

Next, the faulty scan FF narrowing unit 23 references the data stored in the logic circuit test result information storage unit 41 and, based on the faulty scan chain information recorded in the faulty scan chain storage unit 42, performs a defective circuit test using a pattern in which the logical value applied to the faulty scan chain is all undefined value 'X', compares the observed value of the faulty scan chain of the test result with the simulation value, calculates the range of the faulty scan FF beginning at the scan FF where the values differ, and records the calculated range in the faulty scan FF storage unit 43 (step A3).

The path trace narrowing unit 25 references the logic circuit configuration information, the signal line expected value information, and failure-observed scan FFs recorded in the logic circuit test result information storage unit 41 and, based on the result obtained by the test using the tester 5, extracts a faulty scan FF, which was reached from a failure-observed scan FF observed on the normal scan chain, by tracing back the failure-propagation path while performing the implication procedure for the input side, calculates the range of the faulty scan FFs based on the position relation on the scan chain, and records the calculated range in the faulty scan FF storage unit 43 again (step A6).

The branch-aware fault simulation comparison unit 26 references the logic circuit test result information storage unit 41, faulty scan chain storage unit 42, and faulty scan FF storage unit 43 and, for the faulty scan FF range, distinguishes among the signal lines between scan FFs before and after each branch point, performs the simulation for each of them, compares the fault simulation result and the test result, and outputs the highest matching rate fault candidate to the output device 4 (step A7).

FIG. 4 is a detailed flowchart of the path trace isolation operation (step A6) in the flowchart shown in FIG. 2. Referring to the configuration diagram of the path trace narrowing unit 25 in FIG. 3 and the flowchart in FIG. 4, the following describes the path trace isolation operation in detail.

The failure detection pattern generation unit 251 references the design information in the logic circuit test result information storage unit 41 and the faulty scan chain information in the faulty scan chain storage unit 42 to generate a test pattern in which a failure is not activated during the load operation on the faulty scan chain and the failure is propagated from a faulty scan FF to the normal scan chain during the capture operation. After that, the failure detection pattern generation unit 251 performs the test, as needed, via the tester 5 and records the test result in the logic circuit test result information storage unit 41 (step B1).

The failure-observed scan FF selection unit 252 references the test pattern and the test result in the logic circuit test result information storage unit 41 and the faulty scan chain and the fault type in the faulty scan chain storage unit 42 to select failure observation vectors, one at a time, extracts the failure-observed scan FFs of the selected vector, and passes the extracted failure-observed scan FFs to the failure-propagation path tracing unit 253 (step B2).

The failure-propagation path tracing unit 253 references the configuration information and the signal line expected value in the logic circuit test result information storage unit 41 and the faulty scan chain information in the faulty scan chain storage unit 42 to trace back the failure-propagation path beginning at each failure-observed scan FF, while performing the implication procedure for the input side, for acquiring the path information and records the acquired path information in the path information storage unit 44 (step B3).

The trace-path-reached scan FF checking unit 254 references the logic circuit test result information storage unit 41, faulty scan chain storage unit 42, faulty scan FF storage unit 43, and path information storage unit 44 to calculate a scan FF, to which the failure may be propagated, based on the faulty scan chain information and the path information, compares the calculated result with the existing faulty scan FF range to further narrow the faulty scan FF range, and records the narrowed faulty scan FF range in the faulty scan FF storage unit (step B4).

The trace-path-reached scan FF checking unit 254 references the test result in the logic circuit test result information storage unit 41 and, if there is an unselected failure-observed scan FF (No in step B5), passes control back to step B2 to repeat steps B2-B4 until all failure-observed scan FFs are processed (Yes in step B5).

FIG. 6 is a detailed flowchart showing the branch-aware fault simulation comparison operation (step A7) included in the flowchart shown in FIG. 2. Referring to the configuration diagram of the branch-aware fault simulation comparison unit 26 in FIG. 5 and the flowchart in FIG. 6, the following describes the path trace isolation operation in detail.

First, the faulty scan FF selection unit 261 references the faulty scan chain in the faulty scan chain storage unit 42 and the faulty scan FF range in the faulty scan FF storage unit 43 to select a fault-assumed scan FF for which the scan chain fault simulation is to be performed and passes the selected scan FF to the signal line branch distinguishing unit 262 (step C1).

The signal line branch distinguishing unit 262 references the logic circuit test result information storage unit 41 to distinguish among the signal lines between the scan output of the fault-assumed scan FF and its downstream scan FF based on the branch points and passes the information on each branch signal line to the scan chain fault simulation unit 263 (step C2).

The scan chain fault simulation unit 263 references the design information in the logic circuit test result information storage unit 41 and the fault type stored in the faulty scan chain storage unit 42, assumes a fault for a signal line that has a branch, performs the scan chain fault simulation, and passes the simulation result to the simulation result comparison unit 264 (step C3).

The simulation result comparison unit 264 compares the scan chain fault simulation result with the test result stored in the logic circuit test result information storage unit 41, calculates the matching rates, and outputs the calculation result to the output device 4 (step C4).

The simulation result comparison unit 264 determines the signal line, which has the highest matching rate, as the fault candidate. It is also possible to set a predetermined threshold for outputting the match/mismatch determination result or to output the matching rates as the degree of fault possibility.

The simulation result comparison unit 264 references the faulty scan FF storage unit 43 and, if there is an unselected faulty scan FF candidate (No in step C5), passes control back to step C1 to repeat steps C1-C4 until all faulty scan FF candidates are processed (Yes in step C5).

Next, the following describes the operation of the fault location estimation device in the present exemplary embodiment based on actual data.

The initialization unit 21 in FIG. 1 sets the logic circuit types and the logic states of the input/output terminals, given by the input device 1 and the logic circuit test result information storage unit 41, for initializing the logic states of the signal lines (step A1).

The faulty scan chain identification unit 22 shown in FIG. 1 references the logic circuit test result information storage unit 41, performs the scan chain operation verification test for checking if the scan chain operation is normal, analyzes the scan chain operation verification test result, and records a failed scan chain (that is, faulty scan chain) and its fault type in the faulty scan chain storage unit 42 (step A2).

In the scan chain operation verification test, the load operation and the unload operation are performed but the capture operation is not performed. The expected value of the input test pattern includes a repetition of "0000", "1111", "0011", "0001", "1110", and so on.

For example, the fault type is stuck-at-1 (permanent) if the test result is always "expectation value 0/observed value 1" fault in the upstream side of a particular scan FF, the fault type is stuck-at-0 (permanent) if the test result is always "expectation value 1/observed value 0" fault, the fault type is fail-to-down (permanent) if the test result is always "expectation value 1/observed value 0" fault for the "0001" repetition test pattern, the fault type is fail-to-rise (permanent) if the test result is always "expectation value 0/observed value 1" fault for the "1110" repetition test pattern, and the fault type is open (undefined) if the failure observed value is none of the above.

Next, the faulty scan FF narrowing unit 23 shown in FIG. 1 references the logic circuit test result information storage unit 41 to test a non-defective circuit and a defective circuit, and references the faulty scan chain and its fault type recorded in the faulty scan chain storage unit 42 to compare the test result of the non-defective circuit and that of the defective circuit for the faulty scan chain. And, beginning at the downstream side of the scan chain, the faulty scan FF narrowing unit 23 determines the upstream side, beginning at the first differing scan FF between the two, as the faulty scan FF range and records the determined range in the faulty scan FF storage unit 43 (step A3).

Next, the path trace narrowing unit 25 shown in FIG. 1 references the logic circuit configuration information, signal line expected value information, and failure-observed scan FFs recorded in the logic circuit test result information storage unit 41, traces the failure-propagation path by the implication procedure, based on the test result produced by the tester 5, beginning at the failure-observed scan FF observed on the normal scan chain in the input side direction, extracts the faulty scan FF that is reached, determines the faulty scan FF range based on the position relation on the scan chain, and re-stores the determined range in the faulty scan FF storage unit 43 (step A6).

Next, the branch-aware fault simulation comparison unit 26 shown in FIG. 1 references the logic circuit test result information storage unit 41, faulty scan chain storage unit 42, and faulty scan FF storage unit 43 and, for the faulty scan FF range, distinguishes among the signal lines between scan FFs before and after each branch point. After that, the branch-aware fault simulation comparison unit 26 performs the scan chain fault simulation for each of them, compares the simulation result with the test result, and outputs the highest matching rate faulty scan chain, faulty scan FF, signal line, signal line branch, and fault type to the output device 4 (step A7).

The path trace narrowing unit 25 shown in FIG. 1 performs step A6 in FIG. 2. FIG. 3 is a diagram showing the detailed configuration of the path trace narrowing unit 25, and FIG. 4 is a flowchart showing the detailed operation.

Referring to FIG. 3, the failure detection pattern generation unit 251 references the design information in the logic circuit test result information storage unit 41 and the faulty scan chain information in the faulty scan chain storage unit 42 to perform the set/reset operation for the faulty scan chain for initializing the scan FF state values and thereby eliminating the effect of the fault. In addition, the failure detection pattern generation unit 251 repeats the shift operation and the capture operation for generating a test pattern in which a failure is propagated from a faulty scan FF to the normal scan chain, performs the test as needed via the tester 5, and records the test result in the logic circuit test result information storage unit 41 (step B1).

It is also possible to set the input value 'X' in all scan FFs in the faulty scan chain for eliminating the effect of the fault, to perform the combination of the shift operation and the capture operation multiple times for determining the state values, and to repeat the shift operation and the capture operation for generating a test pattern, in which a failure is propagated from a faulty scan FF to the normal scan chain, for use in the execution of the test.

FIGS. 7A-7F are diagrams showing the failure-propagation state when the input value 'X' is set in all observation scan FFs on the faulty scan chain for eliminating the effect of the fault and the combination of the shift operation and the capture operation is performed multiple times for determining the state values. In this example, assume that there are a faulty scan chain (top) and a normal scan chain (bottom) inside a logic circuit and that there is one undefined fault on the faulty scan chain. Referring to FIGS. 7A-7F, the following describes how the failure detection pattern generation unit 251 obtains failure observation information that may be used in the diagnosis.

Figure 7A:
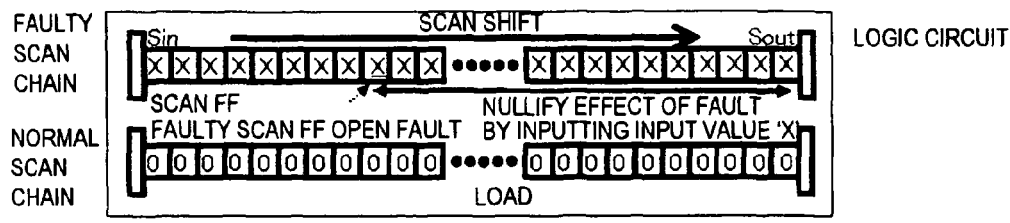
FIGS. 7A-7F are diagrams showing an actual example of an operation (failure-propagation state when a test is performed using a failure detection test pattern) of a fault location estimation device in a first exemplary embodiment.
Figure 7B:
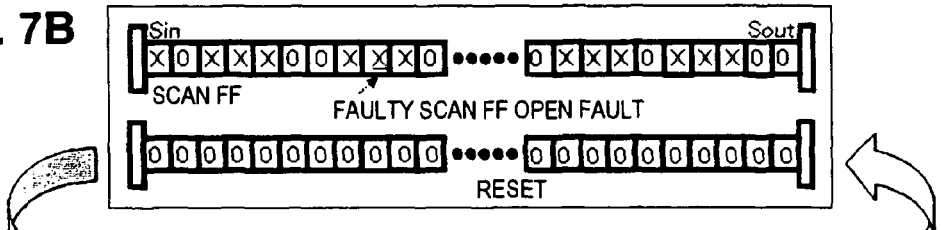
Figure 7C:
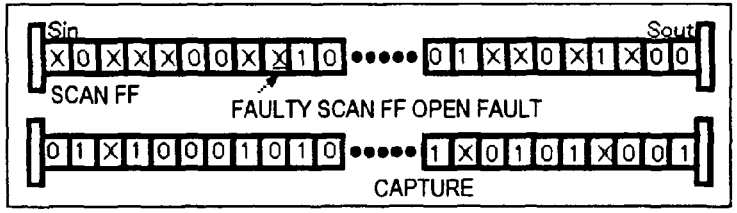

FIG. 7A is a diagram showing the load operation of the logic circuit. The input value 'X' is set on the faulty scan chain to cancel the effect of the fault at scan load time. Next, in FIGS. 7B and 7C, the combination of the reset operation and the capture operation is repeated to determine the state values of the internal scan FFs.

Figure 7D:
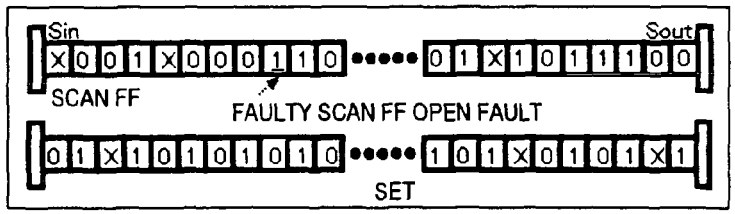
Figure 7E:
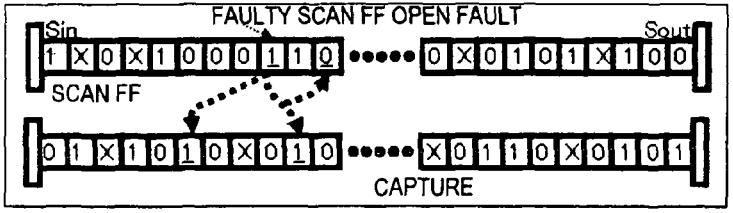

FIG. 7D is a diagram showing that the state value of the faulty scan FF (underlined scan FF) is determined after an operation and that the fault state is activated only in one faulty scan FF. FIG. 7E is a diagram showing the state in which the capture operation is performed after the activation of the faulty scan FF and the fault state is propagated (indicated by the dotted arrow) first to the normal scan chain.

Figure 7F:
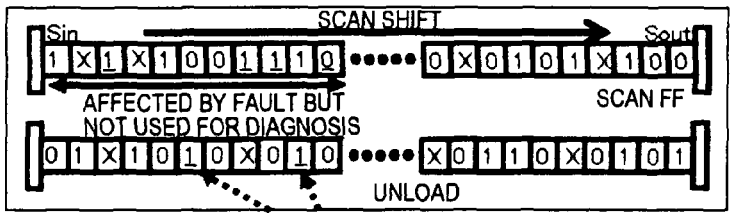

FIG. 7F shows that the scan FFs on the Sin side of the faulty scan chain are affected by the scan unload operation and therefore they may not used for isolating the fault location and, on the other hand, the scan FFs in the fault state observed on the normal scan chain are affected only by the true fault and therefore they may be used for isolating the fault location.

FIG. 7D and FIG. 7E indicate that, by creating the same condition as that for a logic part failure in a logic circuit, in which a fault is present on the scan chain, with the use of a diagnostic pattern, an environment may be created in which a path trace method available for use in the logic part fault diagnostic method and a commercially-available fault diagnostic tool may be used.

The failure-observed scan FF selection unit 252 shown in FIG. 3 references the test pattern and the test result recorded in the logic circuit test result information storage unit 41 and the faulty scan chain and its fault type recorded in the faulty scan chain storage unit 42 to select an arbitrary failure observation vector, extracts the failure-observed scan FFs of the selected vector, and passes them to the failure-propagation path tracing unit 253 (step B2).

Next, the failure-propagation path tracing unit 253 shown in FIG. 3 references the configuration information and the signal line expected value recorded in the logic circuit test result information storage unit and the faulty scan information stored in the faulty scan chain storage unit 42 to trace back the failure-propagation path beginning at each failure-observed scan FF, while performing the implication procedure for the input side, for acquiring the path information and records the acquired path information in the path information storage unit 44 (step B3).

Figure 8A:
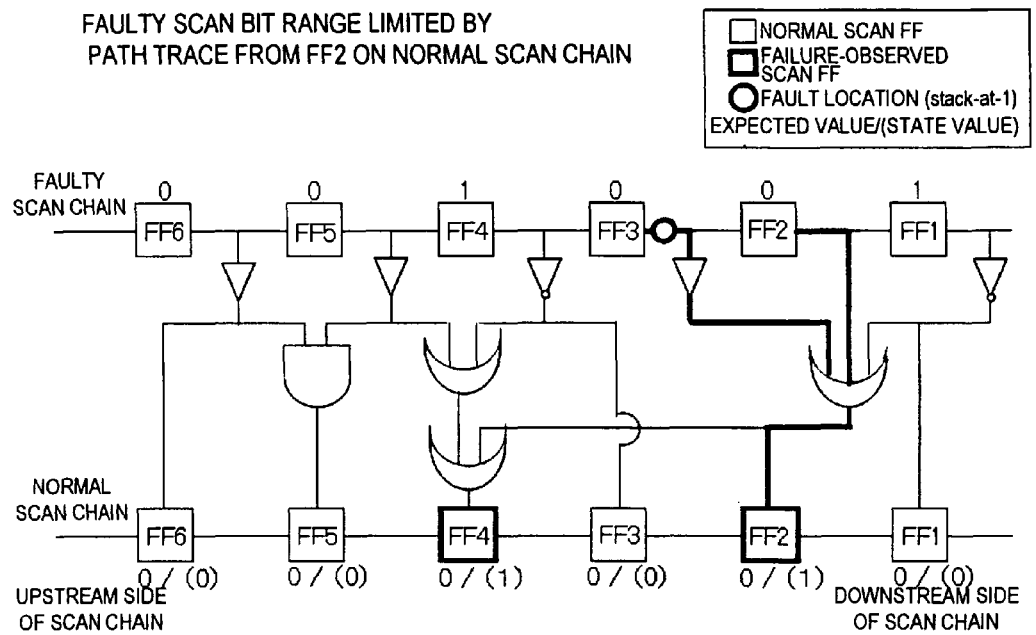
FIGS. 8A and 8B are diagrams showing a method for limiting a faulty scan FF range based on a path trace method of a fault location estimation device in a first exemplary embodiment.
Figure 8B:
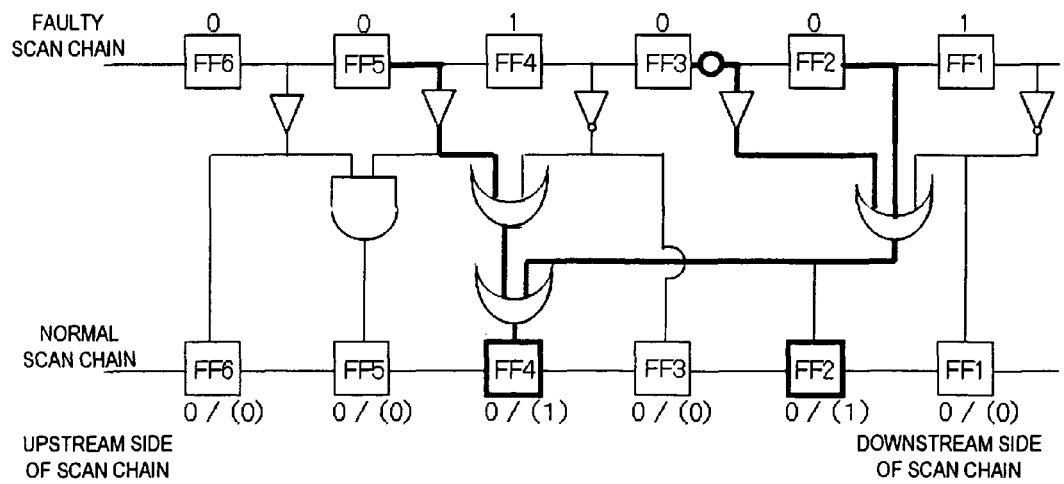

FIGS. 8A and 8B are diagrams showing the trace of a failure-propagation path from a failure-observed scan FF. In FIGS. 8A and 8B, a scan FF indicated by the thin line is a scan FF that observes the normal value and a scan FF indicated by the thick line is a scan FF that observes the failure value. FIG. 8A shows an example in which the path is traced back (thick line) from the scan FF2, which observes a failure on the normal scan chain, while performing the implication procedure for the input side and the origin of failure propagation is narrowed to two locations: scan FF2 and scan FF3 on the faulty scan chain.

FIG. 8B shows an example in which the path is traced back (thick line) from the scan FF4, which observes a failure on the normal scan chain, while performing the implication procedure for the input side, and the origin of failure propagation is narrowed to three locations: scan FF2, scan FF3, scan FF5 on the faulty scan chain. By combining the two examples described above, the fault locations are narrowed in the example in FIGS. 8A and 8B to the scan FF2 and the scan FF3 on the faulty scan chain.

Next, the trace-path-reached scan FF checking unit 254 shown in FIG. 3 references the logic circuit test result information storage unit 41, faulty scan chain storage unit 42, faulty scan FF storage unit 43, and path information storage unit 44 to determine a scan FF, to which the failure may be propagated, based on the faulty scan chain information and the path information, compares the determined result with the existing faulty scan FF range to further narrow the faulty scan FF range, and records the narrowed faulty scan FF range in the faulty scan FF storage unit (step B4).

If there is an unselected failure-observed scan FF (No in step B5), control is passed back to step B2 and the processing from step B2 to step B4 is repeated until the path traces of all failure-observed scan FFs are processed (Yes in step B5).

Because there is another failure-observed scan FF other than the failure-observed scan FF2 in the example shown in FIGS. 8A and 8B, the selection is made again and the processing described above is repeated.

As described above, the range of an undefined-failure faulty scan FF, which cannot be limited in the prior art, can be limited in the present exemplary embodiment by tracing the path beginning at a failure-observed scan FF on the normal scan chain. As a result, the fault location estimation device in the present exemplary embodiment can reduce the number of times the fault simulation, which will be described later, is performed as compared with that in the prior art, allowing for faster, more practical scan chain fault diagnosis.

The branch-aware fault simulation comparison unit 26 shown in FIG. 1 performs step A7 in FIG. 2. FIG. 5 is a diagram showing the detailed configuration of the branch-aware fault simulation comparison unit 26, and FIG. 6 is a flowchart showing the detailed operation.

Referring to FIG. 5, the faulty scan FF selection unit 261 first references the faulty scan chain recorded in the faulty scan chain storage unit 42 and the faulty scan FF range recorded in the faulty scan FF storage unit 43 to select a fault-assumed scan FF for which the scan chain fault simulation is to be performed and passes the selected fault-assumed scan FF to the signal line branch distinguishing unit 262 (step C1).

Next, the signal line branch distinguishing unit 262 shown in FIG. 5 references the logic circuit test result information storage unit 41 to distinguish among the signal lines between the scan output of the fault-assumed scan FF and its downstream scan FF based on the branch points and passes the branch signal line information to the scan chain fault simulation unit 263 (step C2).

Figure 9:
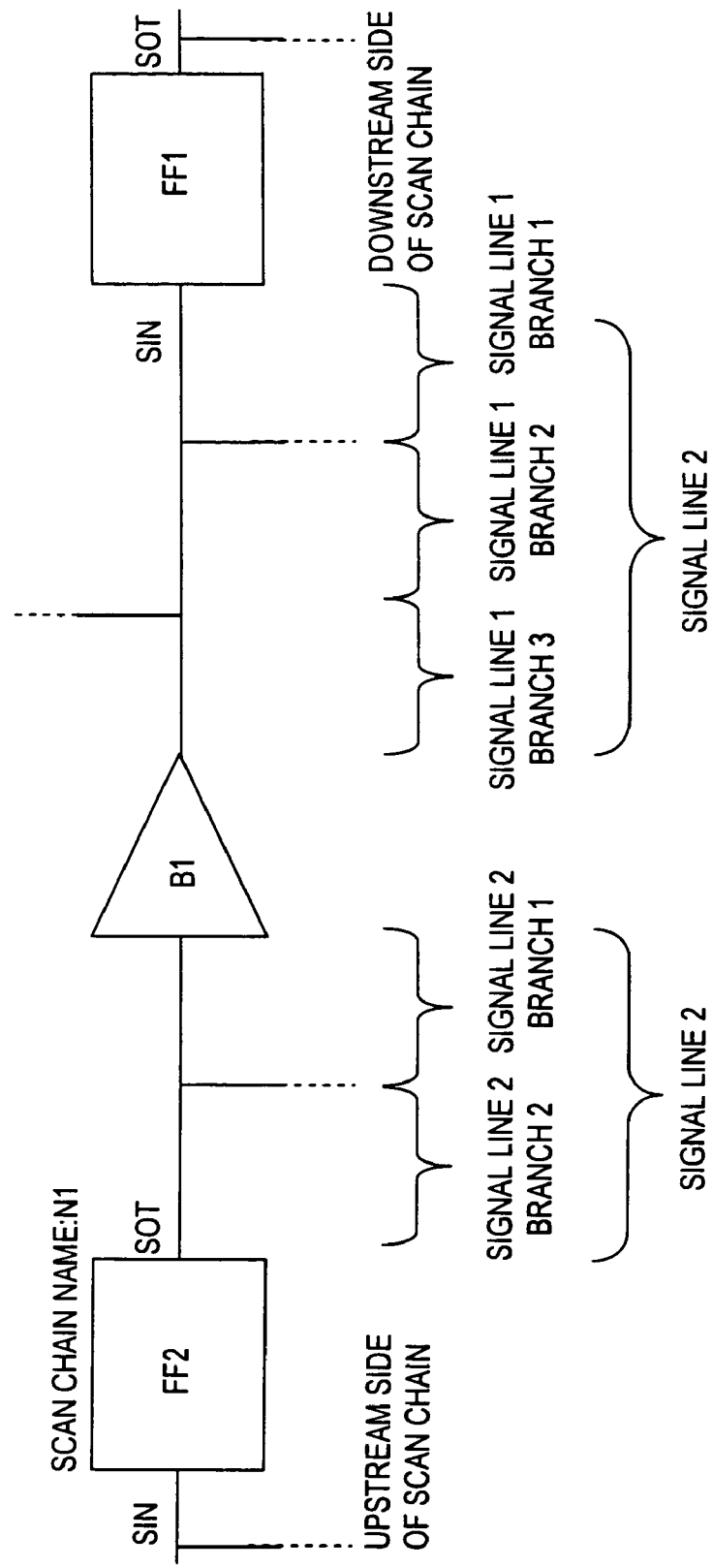
FIG. 9 is a diagram showing an actual example of an operation of a branch-aware fault simulation comparison unit of a fault location estimation device in a first exemplary embodiment.

FIG. 9 is a diagram showing an example of an actual signal line between scan FFs. Referring to FIG. 9, there is buffer B1 between scan FF1 and scan FF2 on the scan chain having the chain name N1. Signal line 1 between scan FF1 and buffer B1 has three branches, and the signal line is divided into three sequentially from the scan FF1 side: signal line 1/branch 1, signal line 1/branch 2, and signal line 1/branch 3. On the other hand, signal line 2 between scan FF2 and buffer B1 has two branches, and the signal line is divided into two sequentially from the buffer B1 side: signal line 2/branch 1 and signal line 2/branch 2.

Scan chain fault simulation, which takes branches into consideration, is performed assuming a fault in each branch. In this case, the scan chain fault simulation accurately reproduces a difference iii fault state propagation caused by branches, thus limiting the fault location more precisely than the prior art.

The scan chain fault simulation unit 263 shown in FIG. 5 references the design information stored in the logic circuit test result information storage unit 41 and the fault type stored in the faulty scan chain storage unit 42, assumes a fault state for the branch signal lines, performs the scan chain fault simulation, and passes the simulation result to the simulation result comparison unit 264 (step C3).

Next, the simulation result comparison unit 264 shown in FIG. 5 compares the scan chain fault simulation result with the test result recorded in the logic circuit test result information storage unit 41, calculates their matching rates, and outputs them to the output device 4 (step C4).

The simulation result comparison unit 264 determines the highest matching rate signal line as the fault candidate. It is also possible to set a predetermined threshold for outputting the match/mismatch determination result or to output the matching rate as the degree of fault possibility.

If there is an unselected faulty scan FF candidate (No in step C5), the simulation result comparison unit 264 passes control back to step C1 to repeat steps C1-C4 until all faulty scan FF candidates are processed (Yes in step C5).

Because, in the example shown in FIG. 9, there is the faulty scan FF candidate FF2 connected to signal line 2 in addition to the faulty scan FF candidate FF1 connected to signal line 1, FF2 is selected and the processing described above is repeated.

As described above, the fault location estimation device in the present exemplary embodiment performs the branch-aware fault simulation and compares the simulation result with the test result, thus pointing out the fault location sections more accurately than the prior-art fault location estimation device that points them out vaguely. This means that, the scan chain fault diagnosis can be performed more accurately with the fault location estimation device in the present exemplary embodiment than with the prior-art fault location estimation device.

Figures 21A, 21B:
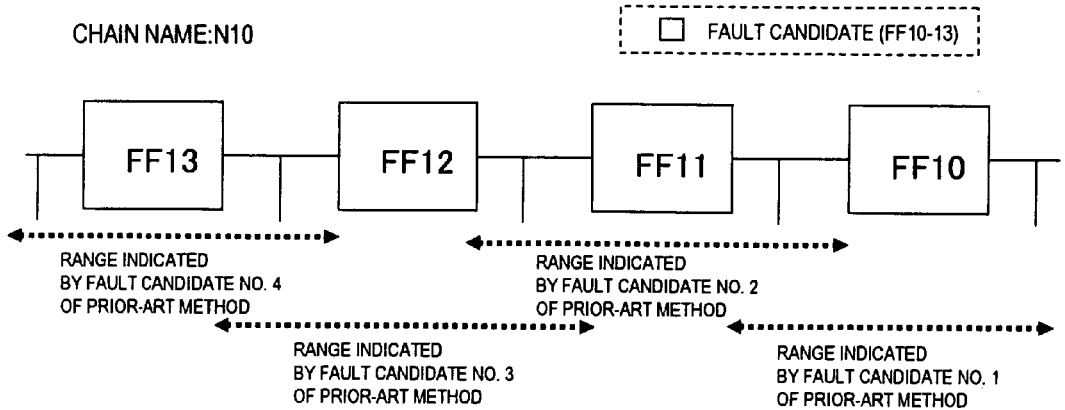
FIGS. 21A and 21B are diagrams showing an output example of scan chain fault diagnosis result obtained by a prior-art fault location estimation device.

The prior-art fault location estimation device assumes that a faulty scan FF itself fails. For this reason, the prior-art fault location estimation device outputs only the faulty scan chain names and the faulty scan FF numbers, indicating the range of the fault locations vaguely. For example, referring to FIGS. 21A and 21B, the actual fault locations such as those indicated by the circle in FIGS. 8A and 8B are indicated by both "scan chain name: N1, scan FF name: FF11" and "scan chain name: N10, scan FF name: FF12". In such a case, judging the fault locations in the actual analysis using this output requires skill.

Figures 10A, 10B:
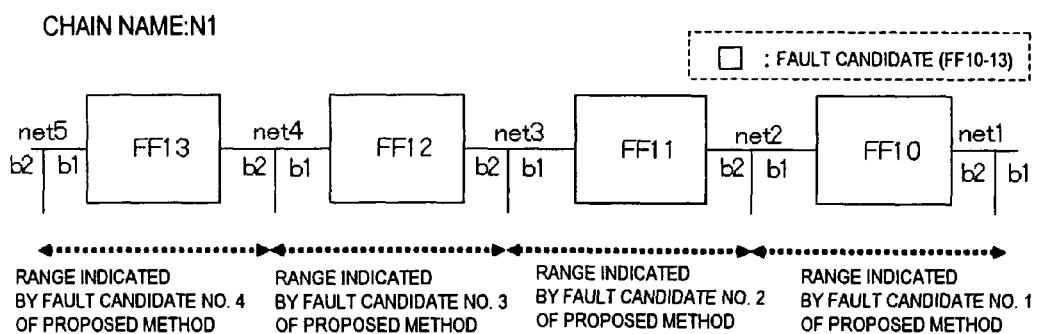
FIGS. 10A and 10B are diagrams showing an output example of scan chain fault diagnosis result obtained by a fault location estimation device in a first exemplary embodiment.

FIGS. 10A and 10B are diagrams showing an example of the diagnosis result output by the fault location estimation device in the present exemplary embodiment. FIG. 10A shows an example of the result of actual diagnosis output by the fault location estimation device in the present exemplary embodiment. FIG. 10B is a diagram showing the range of the fault locations indicating the diagnosis result in FIG. 10A.

Referring to FIG. 10A, the output includes scan chain names, scan FF numbers, fault types, signal line names, signal line branch information, and matching rates. It is preferable that, as the diagnosis result, weights should be put on the fault locations considering signal line branches based on the matching rates so that the fault locations are output sequentially in the descending order of the weights. This allows the actual fault range to be limited more easily and makes easier the selection of analyzed locations in the actual analysis.

(Second Exemplary Embodiment)

Figure 11:
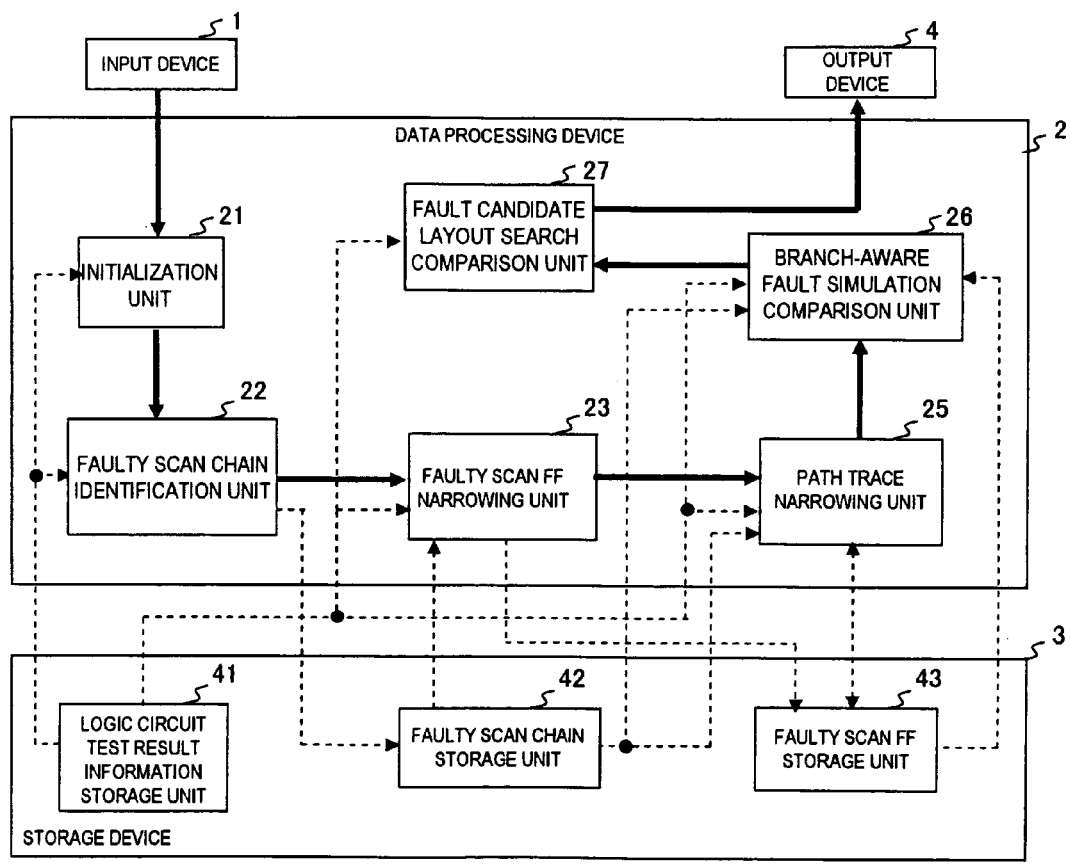
FIG. 11 is a block diagram showing a configuration of a fault location estimation device in a second exemplary embodiment.
Figure 12:
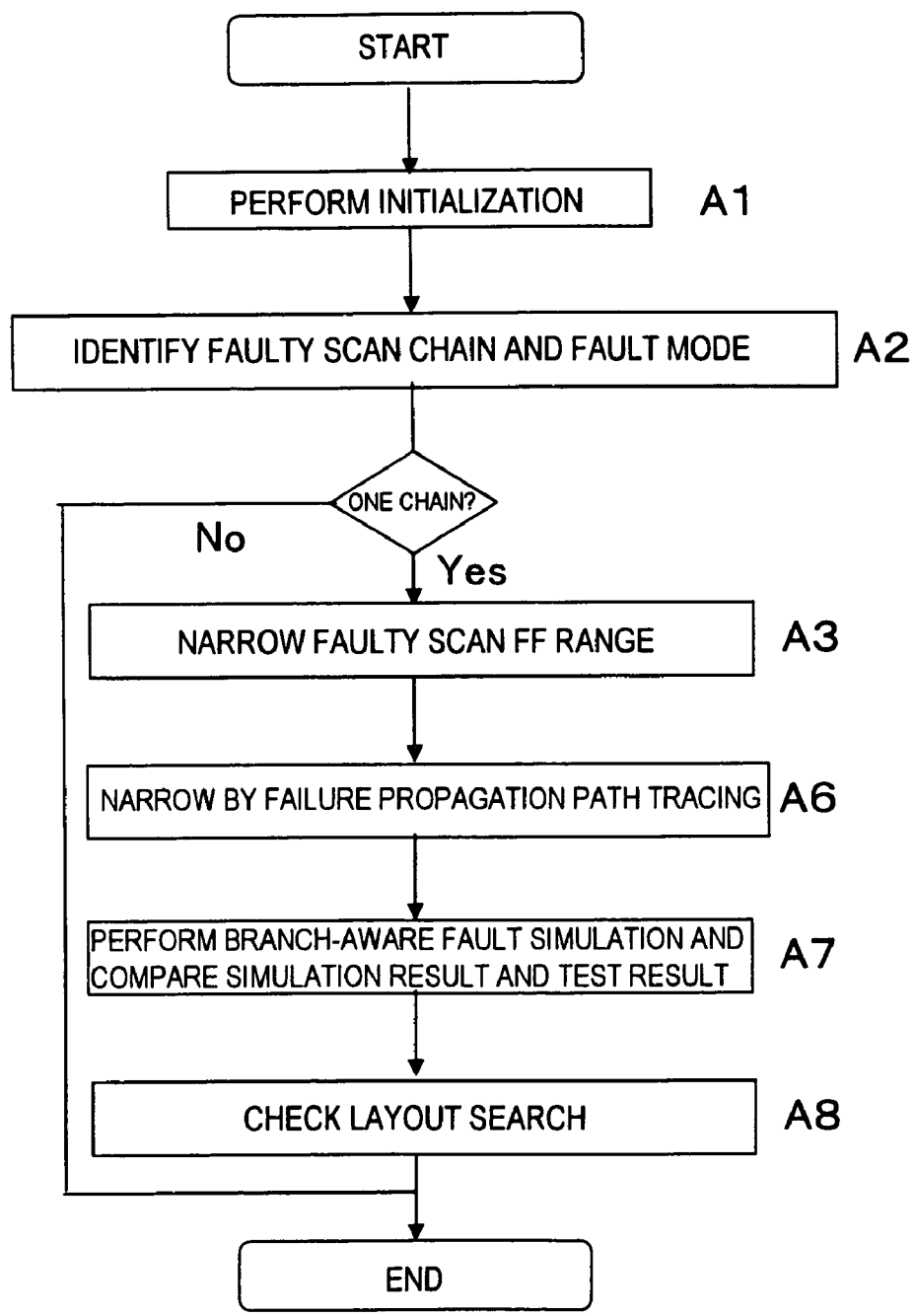
FIG. 12 is a flowchart showing an operation of a fault location estimation device in a second exemplary embodiment.

A fault location estimation device in a second exemplary embodiment of the present invention will be described below with reference to the drawings. FIG. 11 is a block diagram showing the configuration of the fault location estimation device in the present exemplary embodiment. FIG. 12 is a flowchart showing the operation of the fault location estimation device in the present exemplary embodiment.

A fault candidate layout search comparison unit 27 shown in FIG. 11 receives the diagnosis result, as well as the layout information as the additional information, searches the layout information using the fault location obtained as the diagnosis result, and checks the hierarchy information on the layout information, the neighboring net information, and the state value information on the signal lines (step A8 in FIG. 12).

Figure 13A:
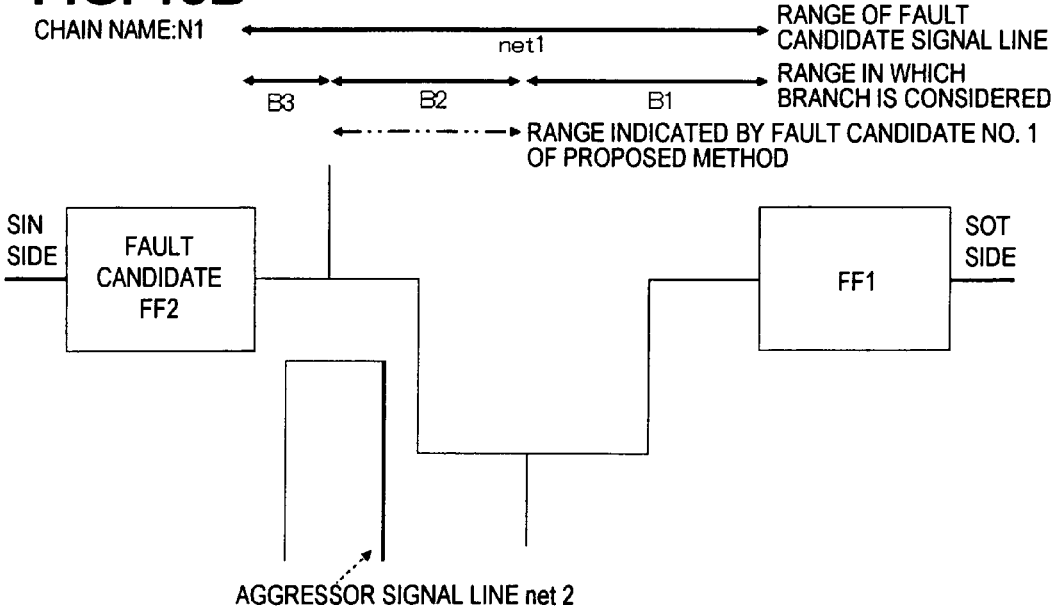
Figure 14:
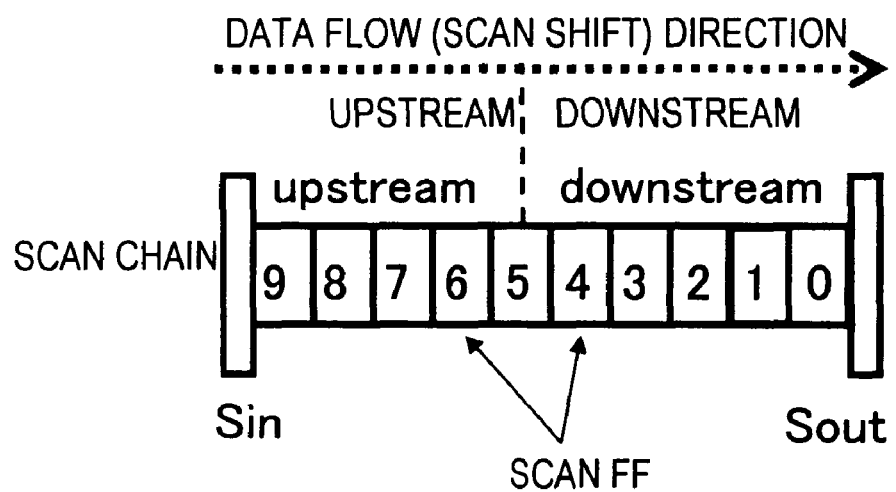
FIG. 14 is a diagram showing an operation and terms of a scan chain.
Figure 15:
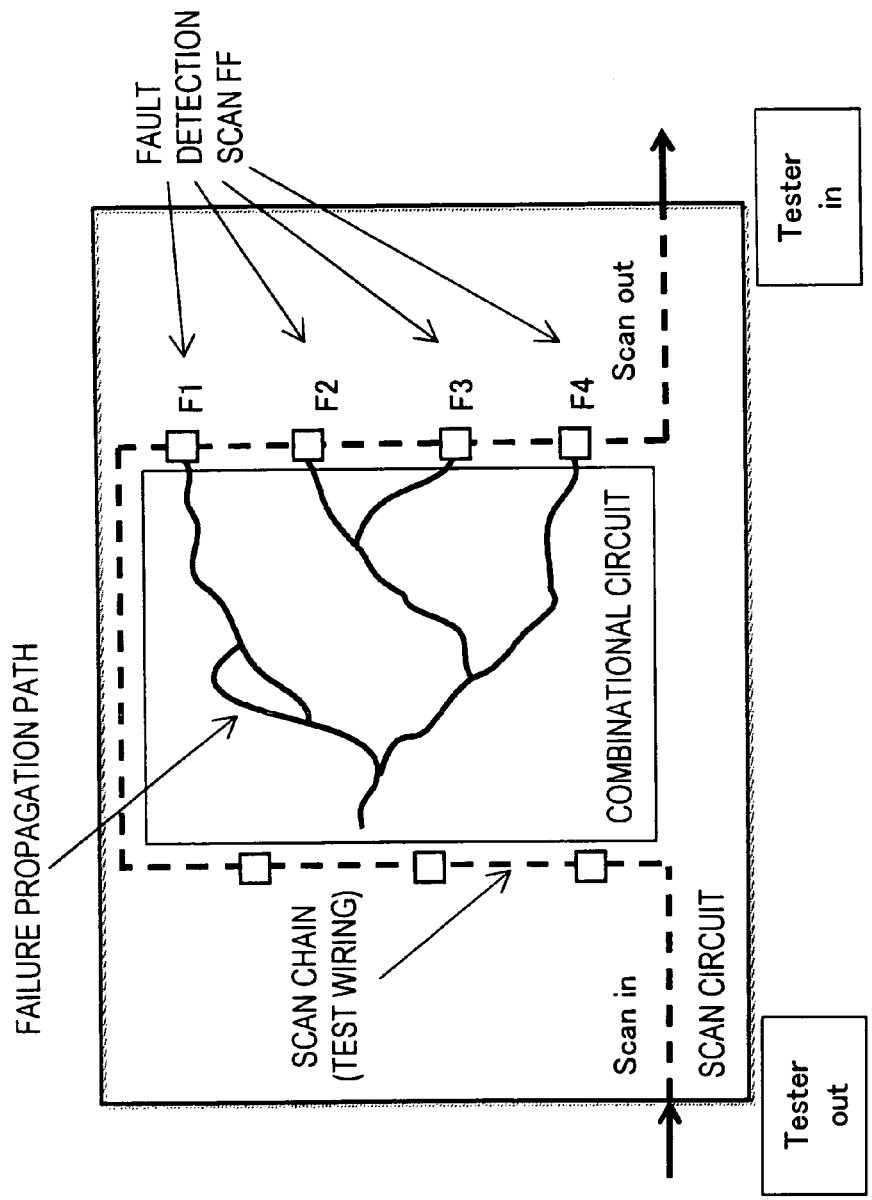
FIG. 15 is a diagram showing a scan circuit.
Figure 16:
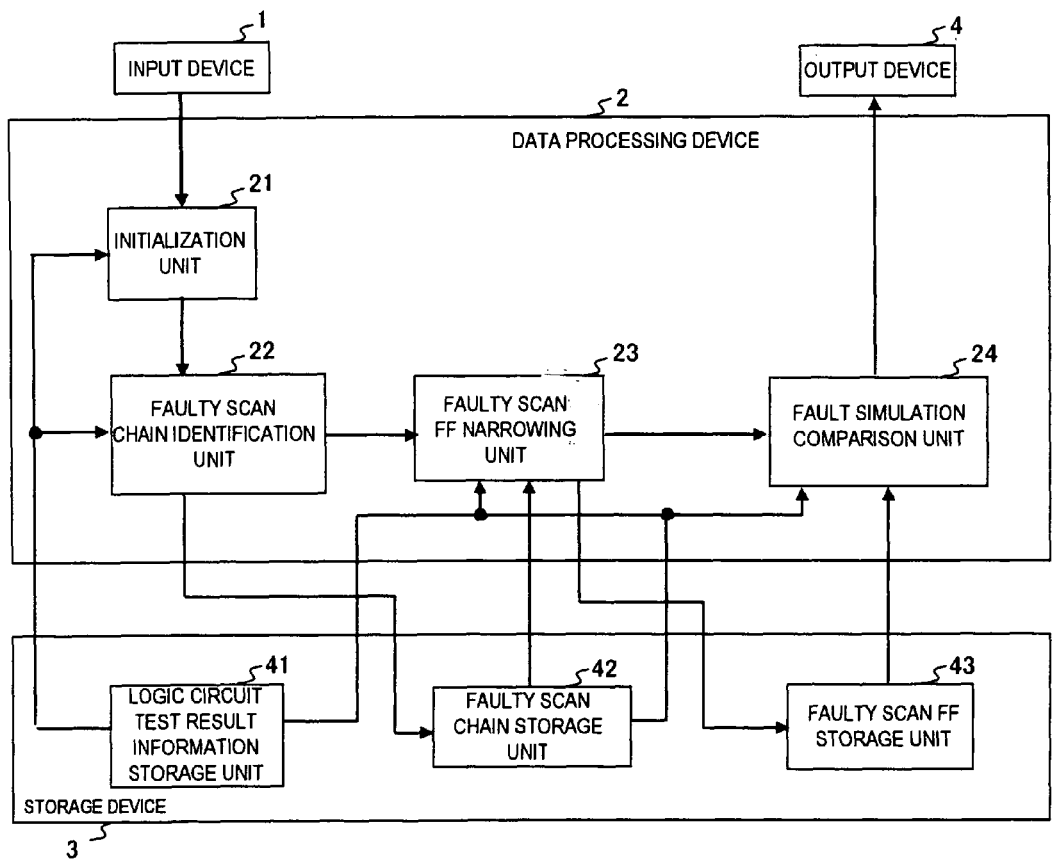
FIG. 16 is a block diagram showing a configuration of a prior-art fault location estimation device.
Figure 17:
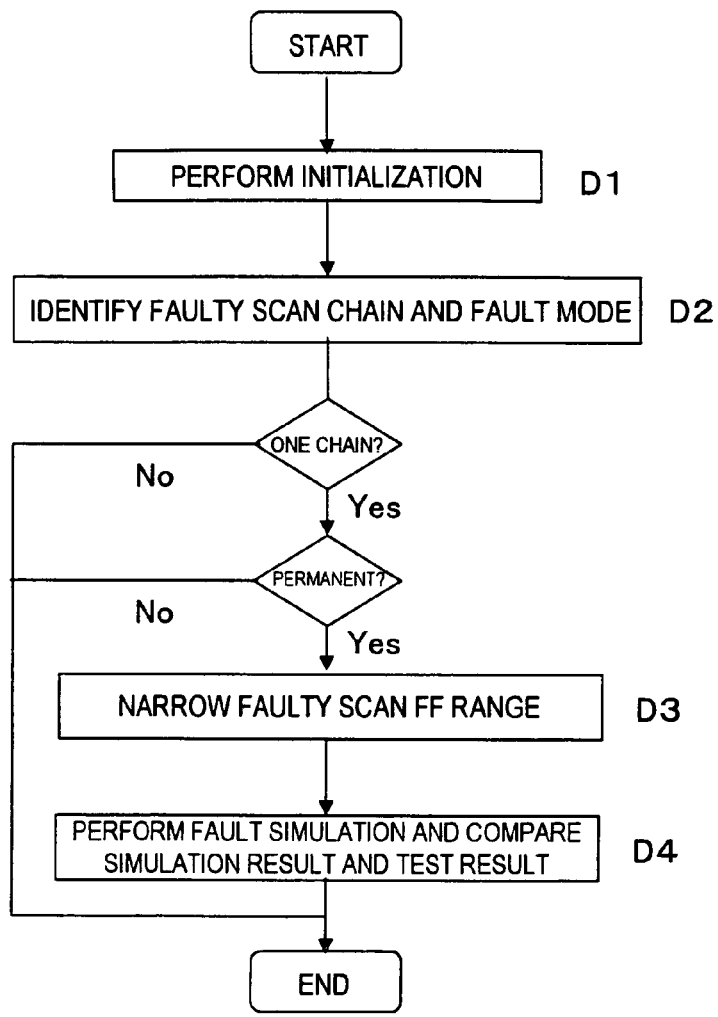
FIG. 17 is a flowchart showing an operation of a prior-art fault location estimation device.
Figure 18:
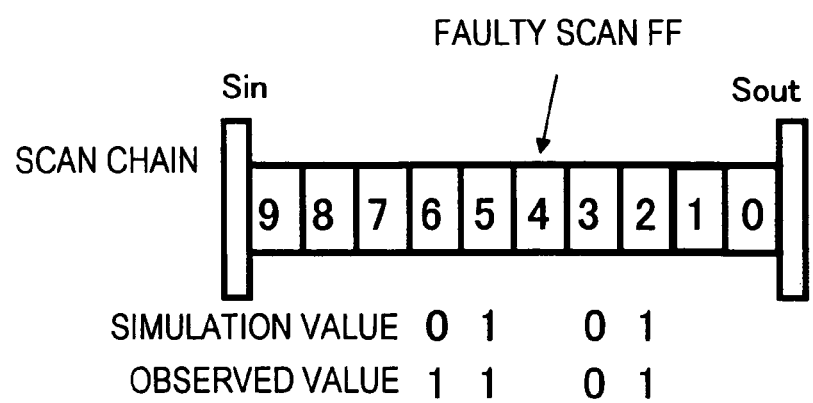
FIG. 18 is a diagram showing a faulty scan FF isolation method used by a prior-art fault location estimation device.
Figure 20:
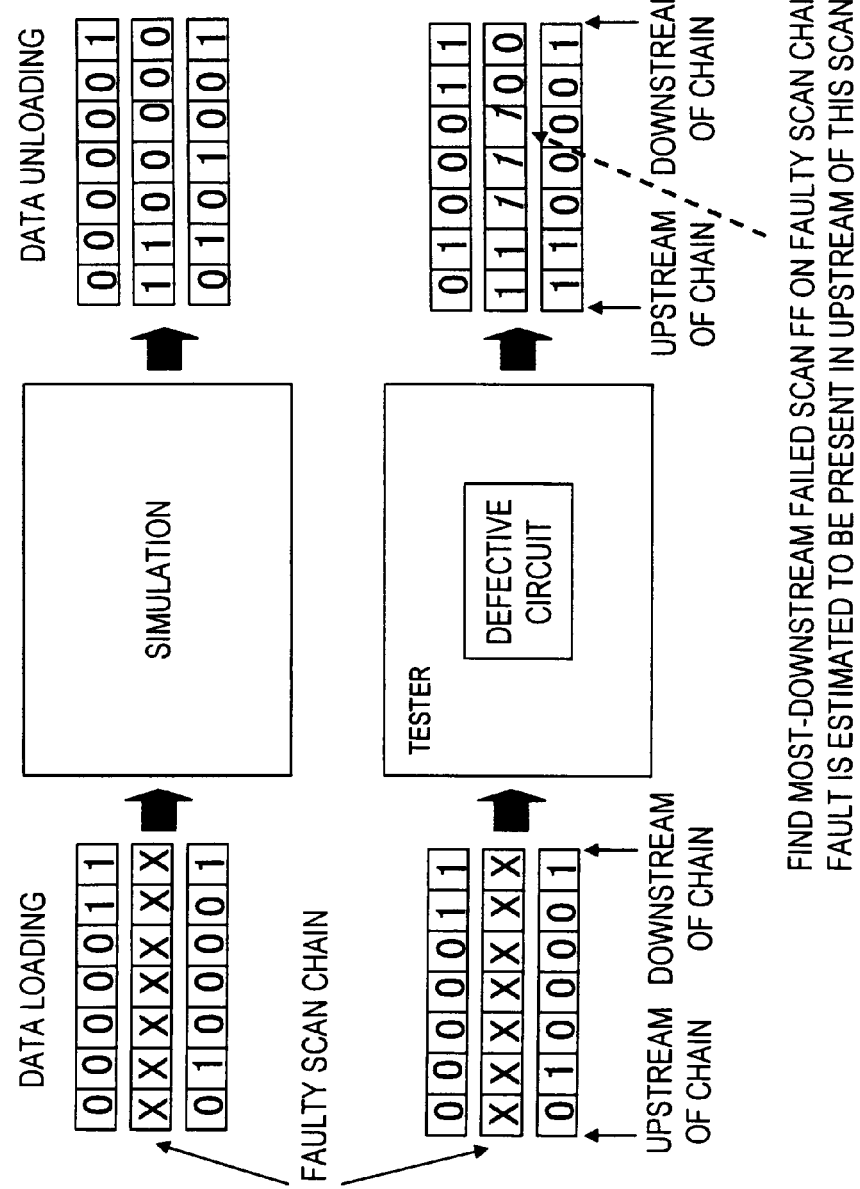
FIG. 20 is a diagram showing a practical example of an operation of a faulty scan FF narrowing unit of a prior-art fault location estimation device.

FIGS. 13A and 13B are diagrams showing an example of diagnosis result and the fault ranges output by the fault location estimation device in the present exemplary embodiment. Referring to FIG. 13A, the fault location estimation device in the present exemplary embodiment outputs the layout of fault locations, coordinate information on the fault locations, names of hierarchy in which a fault is likely to be present, and aggressor signal line names. This output information further increases the accuracy of diagnosis and the ease of analysis.

The present invention is applicable to a fault location estimation device, which estimates scan chain fault locations from the logic circuit information and test results, and to a program that implements the fault location estimation device on a computer. In the framework of entire disclosure of the present invention (including the claims), and based on its basic technological idea, exemplary embodiments or examples of the present invention may be changed and/or adjusted. Also it should be noted that in the framework of the claims of the present invention, any combinations or selections of various elements disclosed herein are possible. That is, needless to say, it is understood by those skilled in the art that various changes or modifications can be made to the present invention based on the disclosure of the present invention including the claims and the technological idea of the present invention.

What is claimed is:

1. A fault location estimation device, comprising:
a faulty scan chain identification unit that identifies a faulty scan chain and a fault type thereof based on a result of a scan chain operation verification test;
a faulty scan flip-flop (scan FF) narrowing unit that compares a test result, as an observed value, of a faulty scan chain of a defective circuit with a simulation result for determining a faulty scan FF range beginning at a location of a scan FF where both results differ; and
a path trace narrowing unit that references logic circuit configuration information, a signal line expected value, a failure-observed scan FF, and a test result of a defective circuit to extract a scan FF on the faulty scan chain, which is reached from a failure-observed scan FF observed on a normal scan chain by tracing back a failure-propagation path while performing an implication procedure for an input side and, based on a position of the extracted scan FF on the scan chain, determines a faulty scan FF range for further narrowing the faulty scan FF range determined by said faulty scan FF narrowing unit.

2. The fault location estimation device as defined by claim 1, further comprising a branch-aware fault simulation comparison unit that references the logic circuit configuration information, the signal line expected value, faulty scan chain information, and the faulty scan FF range and, when a signal line between scan FFs branches, distinguishes between fault candidates before and after a branch point, assumes a fault for each fault candidate, performs a scan chain fault simulation, compares a fault simulation result with the test result of the defective circuit, and outputs a highest matching rate scan FF, including a signal line and a fault type thereof, as a fault candidate.

3. The fault location estimation device as defined by claim 1, wherein said faulty scan chain identification unit identifies the faulty scan chain and the fault type thereof based on an assumption that a fault is present on a single scan chain in a scan circuit.

4. The fault location estimation device as defined claim 1, wherein, at a defective circuit test time, said faulty scan FF narrowing unit performs a test using a pattern in which all logical values applied to the faulty scan chain are an undefined value.

5. The fault location estimation device as defined by claim 1, wherein said path trace narrowing unit determines a part, which is common to the determined faulty scan FF range and the faulty scan FF range determined by said faulty scan FF narrowing unit, as a new faulty scan FF range.

6. A fault location estimation device that narrows a range, where a possibility of a fault on a faulty scan chain is high, based on failure-observed scan flip-flop (scan) information acquired from a test result of a logic circuit, said fault location estimation device comprising:
- a faulty scan chain identification unit that references logic circuit configuration information, a signal line expected value, and a test result of a scan chain operation verification test, which are stored in a logic circuit test result information storage unit, to determine a number of faulty scan chains and a fault type thereof and, for a test result of a fault determined to be a single scan chain fault, records a faulty scan chain in the logic circuit and the fault type in a faulty scan chain storage unit;
- a faulty scan FF narrowing unit that references test results of a non-defective circuit and a defective circuit, using the faulty scan chain and the fault type recorded in said faulty scan chain storage unit, to determine a faulty scan FF range based on a difference in an output value on the faulty scan chain between the test result of the non-defective circuit and the test result of the defective circuit, and records the faulty scan FF range in a faulty scan FF storage unit;
- a path trace narrowing unit that references the faulty scan chain recorded in said faulty scan chain storage unit, references failure-observed scan FF information, which is obtained by inputting after a scan load operation a test pattern that is a combination of set/reset operation, a shift operation, and a capture operation, and the logic circuit configuration information and the signal line expected value, which are stored in said logic circuit test result information storage unit, to extract a scan FF on the faulty scan chain that is reached when a path is traced from the failure-observed scan FF while making an estimation in an implication mode, further narrows the faulty scan FF range based on a position relation of the extracted scan FF, and records the narrowed faulty scan FF range again in said faulty scan FF storage unit; and
- an output unit that outputs the faulty scan chain, the faulty scan FF, and the fault type.

7. The fault location estimation device as defined by claim 6, wherein said path trace narrowing unit references the faulty scan chain recorded in said faulty scan chain storage unit, references the failure-observed scan FF information, which is detected first when an internal logic is determined by repeatedly inputting, after inputting an undefined value into the faulty scan chain at scan load operation time, a test pattern that is a combination of the shift operation and the capture operation, and references the logic circuit configuration information and the signal line expected value, which are recorded in said logic circuit test result information storage unit, to extract a scan FF on the faulty scan chain that is reached when a path is traced from the failure-observed scan FF while making an estimation in said implication mode, further narrows the faulty scan FF range based on a position relation of the extracted scan FF, and records the narrowed faulty scan FF range again in said faulty scan FF storage unit.

8. The fault location estimation device as defined by claim 6, further comprising a branch-aware fault simulation comparison unit that references said logic circuit test result information storage unit, said faulty scan chain storage unit, and said faulty scan FF storage unit to reference the logic circuit configuration, signal line expected value, faulty scan chain, faulty scan FF range, and the fault type of the faulty scan chain, performs a scan chain fault simulation for a signal line between scan FFs in the faulty scan FF range considering a branch state of the signal line, and compares a simulation result with the test result to output a signal line having a high rate of matching between the simulation result and the test result, and wherein said output unit further outputs a faulty signal line and a faulty branch position of the faulty signal line.

9. The fault location estimation device as defined by claim 8, further comprising a fault candidate layout search comparison unit that references the faulty scan chain, faulty scan FF, fault type, faulty signal line, and a branch position of the faulty signal line output by said output unit and, at the same time, references the logic circuit configuration, signal line expected value, and layout information on the logic circuit which are stored in said logic circuit test result information storage unit, searches for coordinate information on the faulty signal line, displays a layout from the coordinate information, calculates a hierarchy of the fault location from the fault branch position of the faulty signal line, calculates neighboring signal lines from the layout information, calculates an aggressor signal line through comparison with the expected value information, and outputs layout information on the fault location, and
wherein said output unit further outputs the layout information of the fault location, the coordinate information on the fault location, the name of a hierarchy in which the fault is likely to be present, and anaggressor signal line name.

10. A fault location estimation method, said method being performed by a fault location estimation device for determining a location of a fault, said method comprising:
- identifying a faulty scan chain and a fault type thereof based on a result of a scan chain operation verification test;
- comparing a test result, as an observed value, of a faulty scan chain of a defective circuit with a simulation result for determining a faulty scan flip-flop range beginning at a location of a scan flip-flop (hereinafter called a "scan FF") where both results differ; and
- referencing logic circuit configuration information, a signal line expected value, a failure-observed scan FF, and a test result of a defective circuit to extract a scan FF on the faulty scan chain, which is reached from a failure-observed scan FF observed on a normal scan chain by tracing back a failure propagation path while performing an implication procedure for an input side and, based on a position of the extracted scan FF on the scan chain, determines a faulty scan FF range for further narrowing the faulty scan FF range determined by said comparing.

11. The fault location estimation method as defined by claim 10, further comprising:
- referencing the logic circuit configuration information, the signal line expected value, faulty scan chain information, and faulty scan FF range and, when a signal line between scan FFs branches, distinguishing between fault candidates before and after a branch point;
- assuming a fault for each fault candidate;
- performing a scan chain fault simulation;
- comparing a fault simulation result with the test result of the defective circuit; and
- outputting a highest matching rate scan FF, including a signal line and a fault type thereof, as a fault candidate.

12. The fault location estimation method as defined by claim 10, wherein said comparing comprises performing a test at a defective circuit test time using a pattern in which all logical values applied to the faulty scan chain are an undefined value.

13. The fault location estimation method as defined by claim 10, wherein said referencing comprises determining a part, which is common to the determined faulty scan FF range and the faulty scan FF range determined by said comparing, as a new faulty scan FF range.

* * * * *